United States Patent
Lyon

(10) Patent No.: US 11,994,350 B2
(45) Date of Patent: May 28, 2024

(54) FLUID HEAT EXCHANGE SYSTEMS

(71) Applicant: CoolIT Systems Inc., Calgary (CA)

(72) Inventor: Geoff Sean Lyon, Calgary (CA)

(73) Assignee: CoolIT Systems, Inc. (CA)

(*) Notice: Subject to any disclaimer, the term of this patent is extended or adjusted under 35 U.S.C. 154(b) by 0 days.

(21) Appl. No.: 17/169,536

(22) Filed: Feb. 7, 2021

(65) Prior Publication Data

US 2021/0164736 A1 Jun. 3, 2021

Related U.S. Application Data

(63) Continuation of application No. 16/297,289, filed on Mar. 8, 2019, now abandoned, which is a
(Continued)

(51) Int. Cl.
*F28F 3/12* (2006.01)
*F28D 15/00* (2006.01)
(Continued)

(52) U.S. Cl.
CPC ............ *F28F 3/12* (2013.01); *F28D 15/00* (2013.01); *F28F 3/048* (2013.01); *H01L 23/473* (2013.01); *H01L 2924/0002* (2013.01)

(58) Field of Classification Search
CPC .. F28F 3/12; F28F 3/048; F28D 15/00; H01L 23/473; H01L 2924/0002
(Continued)

(56) References Cited

U.S. PATENT DOCUMENTS

| 3,073,385 A | 1/1963 | Peters |
| 3,817,321 A | 6/1974 | Von Cube et al. |

(Continued)

FOREIGN PATENT DOCUMENTS

| CN | 2562368 | 7/2003 |
| DE | 20305281 | 4/2002 |

(Continued)

OTHER PUBLICATIONS

Petition for Inter Partes Review in *Asetek Danmark A/S v. CoolIT Systems, Inc.*, Feb. 7, 2020, Case IPR2020-00522.
(Continued)

*Primary Examiner* — Claire E Rojohn, III
(74) *Attorney, Agent, or Firm* — Workman Nydegger

(57) ABSTRACT

A fluid heat exchanger includes: a heat spreader plate including an intended heat generating component contact region; a plurality of microchannels for directing heat transfer fluid over the heat spreader plate, the plurality of microchannels each having a first end and an opposite end and each of the plurality of microchannels extending substantially parallel with each other microchannel and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening. A method of cooling a heat generating component uses a fluid heat exchanger that splits a mass flow of coolant.

31 Claims, 12 Drawing Sheets

Related U.S. Application Data continuation of application No. 15/912,478, filed on Mar. 5, 2018, now Pat. No. 10,274,266, which is a continuation of application No. 15/263,210, filed on Sep. 12, 2016, now Pat. No. 9,909,820, which is a continuation of application No. 13/401,618, filed on Feb. 21, 2012, now Pat. No. 9,453,691, which is a continuation-in-part of application No. 12/189,476, filed on Aug. 11, 2008, now Pat. No. 8,746,330.

(60) Provisional application No. 61/512,379, filed on Jul. 27, 2011, provisional application No. 60/954,987, filed on Aug. 9, 2007.

(51) Int. Cl.
*F28F 3/04* (2006.01)
*H01L 23/473* (2006.01)

(58) Field of Classification Search
USPC .................................................. 165/104.31
See application file for complete search history.

(56) References Cited

U.S. PATENT DOCUMENTS

| | | | |
|---|---|---|---|
| 3,861,826 A | 1/1975 | Dean, Jr. |
| 4,139,330 A | 2/1979 | Neal |
| 4,450,472 A | 5/1984 | Tuckerman et al. |
| 4,561,040 A | 12/1985 | Eastman et al. |
| 4,563,620 A | 1/1986 | Komatsu |
| 4,564,040 A | 1/1986 | Rudelick |
| 4,750,086 A | 6/1988 | Mittal |
| 4,758,926 A | 7/1988 | Herrell et al. |
| 4,768,581 A | 9/1988 | Gotwald et al. |
| 4,898,153 A | 2/1990 | Sherwood |
| 4,909,315 A | 3/1990 | Nelson et al. |
| 4,940,085 A | 7/1990 | Nelson et al. |
| 5,016,090 A | 5/1991 | Galyon et al. |
| 5,070,936 A | 12/1991 | Carroll et al. |
| 5,099,311 A | 3/1992 | Bonde et al. |
| 5,203,401 A | 4/1993 | Hamburgen et al. |
| 5,218,515 A | 6/1993 | Bernhardt |
| 5,265,670 A | 11/1993 | Zingher |
| 5,277,232 A | 1/1994 | Borsheim |
| 5,294,830 A | 3/1994 | Young et al. |
| 5,309,319 A | 5/1994 | Messina |
| 5,441,102 A | 8/1995 | Burward-Hoy |
| 5,453,641 A | 9/1995 | Mundinger et al. |
| 5,592,363 A | 1/1997 | Atarashi et al. |
| 5,727,618 A | 3/1998 | Mundinger et al. |
| 5,731,954 A | 3/1998 | Cheon |
| 5,823,249 A | 10/1998 | Batchelder |
| 5,835,347 A | 11/1998 | Chu |
| 5,841,634 A | 11/1998 | Visser |
| 5,864,464 A | 1/1999 | Lin |
| 5,998,240 A | 12/1999 | Hamilton et al. |
| 6,014,312 A | 1/2000 | Schulz-Harder et al. |
| 6,019,165 A | 2/2000 | Batchelder |
| 6,166,907 A | 12/2000 | Chien |
| 6,263,957 B1 | 7/2001 | Chen et al. |
| 6,361,287 B1 | 3/2002 | Hopper |
| 6,408,937 B1 | 6/2002 | Roy |
| 6,415,853 B1 | 7/2002 | Tao et al. |
| 6,415,860 B1 | 7/2002 | Kelly et al. |
| 6,422,304 B1 | 7/2002 | Slovikosky |
| 6,447,270 B1 | 9/2002 | Schmidt et al. |
| 6,679,315 B2 | 1/2004 | Cosley et al. |
| 6,702,002 B2 | 3/2004 | Wang et al. |
| 6,748,755 B2 | 6/2004 | Kubo et al. |
| 6,827,128 B2 | 12/2004 | Philpott et al. |
| 6,894,899 B2 | 5/2005 | Wu et al. |
| 6,945,653 B2 | 9/2005 | Kobori et al. |
| 6,952,345 B2 | 10/2005 | Weber et al. |
| 6,986,382 B2 | 1/2006 | Upadhya et al. |
| 6,988,534 B2 | 1/2006 | Kenny et al. |
| 7,000,684 B2 | 2/2006 | Kenny et al. |
| 7,007,506 B2 | 3/2006 | Kubo et al. |
| 7,021,367 B2 | 4/2006 | Oikawa |
| 7,029,647 B2 | 4/2006 | Tonkovich et al. |
| 7,032,651 B2 | 4/2006 | Winslow et al. |
| 7,055,581 B1 | 6/2006 | Roy |
| 7,104,312 B2 | 9/2006 | Goodson et al. |
| 7,124,811 B2 | 10/2006 | Crocker et al. |
| 7,131,486 B2 | 11/2006 | Goodson et al. |
| 7,143,816 B1 | 12/2006 | Ghosh et al. |
| 7,156,159 B2 | 1/2007 | Lovette et al. |
| 7,156,160 B2 | 1/2007 | Lee et al. |
| 7,190,580 B2 | 3/2007 | Bezama et al. |
| 7,201,217 B2 | 4/2007 | Johnson et al. |
| 7,206,203 B2 | 4/2007 | Campbell et al. |
| 7,209,355 B2 | 4/2007 | Koga et al. |
| 7,248,006 B2 | 7/2007 | Bailey et al. |
| 7,259,965 B2 | 8/2007 | Chang et al. |
| 7,264,359 B2 | 9/2007 | Kawahara et al. |
| 7,274,566 B2 | 9/2007 | Campbell et al. |
| 7,301,771 B2 | 11/2007 | Hata et al. |
| 7,331,378 B2 | 2/2008 | Bhatti et al. |
| 7,360,582 B2 | 4/2008 | Olesen |
| 7,466,553 B2 | 12/2008 | Hamman |
| 7,527,085 B2 | 5/2009 | Iijima et al. |
| 7,544,049 B2 | 6/2009 | Koga et al. |
| 7,562,444 B2 | 7/2009 | Vetter |
| 7,564,208 B2 | 7/2009 | Bailey et al. |
| 7,688,589 B2 | 3/2010 | Chiang |
| 7,762,314 B2 | 7/2010 | Campbell et al. |
| 7,806,168 B2 | 10/2010 | Upadhya et al. |
| 7,971,632 B2 | 7/2011 | Eriksen |
| 8,051,898 B2 | 11/2011 | Chiang |
| 8,066,057 B2 | 11/2011 | Olesen |
| 8,240,362 B2 | 8/2012 | Eriksen |
| 8,245,764 B2 * | 8/2012 | Eriksen ................ H01L 23/473 165/80.4 |
| 8,631,860 B2 | 1/2014 | Tang et al. |
| 8,687,364 B2 | 4/2014 | Chainer et al. |
| 9,453,691 B2 | 9/2016 | Lyon |
| 9,733,681 B2 | 8/2017 | Eriksen |
| 10,222,144 B2 | 3/2019 | Kusuda |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0010050 A1 | 1/2003 | Scott |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0173839 A1 | 9/2003 | Torii et al. |
| 2003/0230400 A1 | 12/2003 | McCordic et al. |
| 2004/0040695 A1 | 3/2004 | Chesser et al. |
| 2004/0042171 A1 | 3/2004 | Takamatsu et al. |
| 2004/0042172 A1 | 3/2004 | Kusaka et al. |
| 2004/0052049 A1 | 3/2004 | Wu et al. |
| 2004/0052663 A1 | 3/2004 | Laing et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112571 A1 | 6/2004 | Kenny et al. |
| 2004/0112585 A1 | 6/2004 | Goodson et al. |
| 2004/0123614 A1 | 7/2004 | Stewart |
| 2004/0182548 A1 | 9/2004 | Lovette et al. |
| 2004/0182560 A1 | 9/2004 | Kenny et al. |
| 2004/0188066 A1 | 9/2004 | Upadhay et al. |
| 2004/0188069 A1 | 9/2004 | Tomioka et al. |
| 2004/0206477 A1 | 10/2004 | Kenny et al. |
| 2004/0250558 A1 | 12/2004 | Nakano et al. |
| 2005/0061482 A1 | 3/2005 | Lee et al. |
| 2005/0069432 A1 | 3/2005 | Tomioka |
| 2005/0178531 A1 | 8/2005 | Huang et al. |
| 2005/0205241 A1 | 9/2005 | Goodson et al. |
| 2005/0210906 A1 | 9/2005 | Laufer et al. |
| 2005/0211417 A1 | 9/2005 | Upadhay et al. |
| 2005/0241809 A1 | 11/2005 | Tomioka et al. |
| 2005/0269061 A1 | 12/2005 | Brewer et al. |
| 2006/0002088 A1 | 1/2006 | Bezama et al. |
| 2006/0011329 A1 | 1/2006 | Wang et al. |

(56) References Cited

U.S. PATENT DOCUMENTS

| | | | |
|---|---|---|---|
| 2006/0094347 | A1 | 5/2006 | Tracy et al. |
| 2006/0096738 | A1 | 5/2006 | Kang et al. |
| 2006/0096740 | A1 | 5/2006 | Zheng |
| 2006/0096743 | A1 | 5/2006 | Lee et al. |
| 2006/0137863 | A1 | 6/2006 | Lee et al. |
| 2006/0162903 | A1 | 7/2006 | Bhatti et al. |
| 2006/0171801 | A1 | 8/2006 | Manabe et al. |
| 2006/0185829 | A1 | 8/2006 | Duan et al. |
| 2006/0185830 | A1 | 8/2006 | Duan |
| 2006/0187638 | A1 | 8/2006 | Vinson et al. |
| 2006/0225867 | A1 | 10/2006 | Park et al. |
| 2006/0231238 | A1 | 10/2006 | Ball, Jr. |
| 2006/0254755 | A1 | 11/2006 | Chen et al. |
| 2007/0029069 | A1 | 2/2007 | Duan |
| 2007/0034356 | A1 | 2/2007 | Kenny et al. |
| 2007/0039719 | A1 | 2/2007 | Eriksen |
| 2007/0125526 | A1 | 6/2007 | Satou et al. |
| 2007/0131396 | A1 | 6/2007 | Yu et al. |
| 2007/0163750 | A1 | 7/2007 | Bhatti et al. |
| 2007/0193724 | A1 | 8/2007 | Lin |
| 2007/0209784 | A1 | 9/2007 | Peng |
| 2007/0227704 | A1 | 10/2007 | Nagai et al. |
| 2007/0272392 | A1 | 11/2007 | Ghosh et al. |
| 2008/0041792 | A1 | 2/2008 | Crnkovich et al. |
| 2008/0053641 | A1 | 3/2008 | Lai et al. |
| 2008/0128114 | A1 | 6/2008 | Lai et al. |
| 2008/0179045 | A1 | 7/2008 | Hu et al. |
| 2008/0266726 | A1 | 10/2008 | Murakami et al. |
| 2008/0288124 | A1 | 11/2008 | Huang |
| 2008/0301941 | A1 | 12/2008 | Anderson, Jr. et al. |
| 2008/0314367 | A1 | 12/2008 | Goulette et al. |
| 2009/0021807 | A1 | 1/2009 | Horita |
| 2009/0071625 | A1 | 3/2009 | Lyon |
| 2009/0101315 | A1 | 4/2009 | Cheng |
| 2009/0139698 | A1 | 6/2009 | Robinson |
| 2010/0012294 | A1* | 1/2010 | Bezama ............. H01L 23/3672 165/80.4 |
| 2010/0103619 | A1 | 4/2010 | Rafai-ahmed et al. |
| 2010/0326634 | A1 | 12/2010 | Eriksen |
| 2011/0313576 | A1 | 12/2011 | Nicewonger |
| 2012/0152498 | A1 | 6/2012 | Lyon |
| 2012/0175094 | A1 | 7/2012 | Rice |
| 2012/0271567 | A1 | 10/2012 | Da Pont et al. |
| 2014/0186156 | A1 | 7/2014 | Lai et al. |
| 2015/0168474 | A1 | 6/2015 | Yoshioka et al. |
| 2015/0355630 | A1 | 12/2015 | Cader et al. |
| 2020/0340767 | A1 | 10/2020 | Holden et al. |
| 2022/0151099 | A1 | 5/2022 | Gao |
| 2022/0151104 | A1 | 5/2022 | Gao |
| 2022/0232732 | A1 | 7/2022 | Alvarado et al. |
| 2022/0377937 | A1 | 11/2022 | Chen et al. |

FOREIGN PATENT DOCUMENTS

| | | |
|---|---|---|
| EP | 574823 | 6/1993 |
| EP | 610826 | 2/1994 |
| EP | 1808892 | 7/2007 |
| JP | 61032449 | 2/1986 |
| JP | H03-17443 | 1/1991 |
| JP | 06120387 | 4/1994 |
| JP | H07142886 | 6/1995 |
| JP | H832262 | 2/1996 |
| JP | 2002151638 | 5/2002 |
| JP | 3452059 | 9/2003 |
| JP | 2005123496 | 5/2005 |
| JP | 2000208683 | 7/2007 |
| JP | 2007180505 | 7/2007 |
| JP | 2007227902 | 9/2007 |
| JP | 2007531991 | 11/2007 |
| KR | 20030031027 | 4/2003 |
| KR | 1020030031027 | 4/2003 |
| KR | 200314041 | 5/2003 |
| KR | 2020030006043 | 5/2003 |
| TW | M244511 | 9/2004 |
| TW | M244513 | 9/2004 |
| TW | M251183 | 11/2004 |
| TW | M251442 | 11/2004 |
| TW | M256682 | 2/2005 |
| TW | M273031 | 8/2005 |
| TW | M275684 | 9/2005 |
| TW | M298733 | 10/2006 |
| TW | M324810 | 1/2008 |
| TW | 200926951 | 6/2009 |
| WO | 2001065900 | 9/2001 |
| WO | 03055055 | 7/2003 |
| WO | 03098415 | 11/2003 |
| WO | 2004042306 | 5/2004 |
| WO | 2005017468 | 2/2005 |
| WO | 2005096377 | 10/2005 |
| WO | 2006052317 | 5/2006 |
| WO | 2006119761 | 11/2006 |

OTHER PUBLICATIONS

Patent Owner's Response in *Asetek Danmark A/S v. CoolIT Systems, Inc.*, Nov. 30, 2020, Case IPR2020-00522.

Petitioner's Reply to Patent Owner's Preliminary Response in *Asetek Danmark A/S v. CoolIT Systems, Inc.*, Jun. 5, 2020, Case IPR2020-00522.

Declaration of Robert F. McCauley in *Asetek Danmark A/S v. CoolIT Systems, Inc.*, Oct. 14, 2020, Case IPR2020-0522.

Declaration of Donald E. Tilton, Ph.D. in *Asetek Danmark A/S v. CoolIT Systems, Inc.*, Nov. 30, 2020, Case IPR2020-0522.

Institution Decision entered Aug. 24, 2020, Case IPR2020-00522.

Non-Final Office Action in U.S. Appl. No. 16/297,289, dated May 6, 2020, 6 pages.

Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.

Notice of Allowance in U.S. Appl. No. 15/912,478, dated Mar. 6, 2019, 11 pages.

Non-Final Office Action for U.S. Appl. No. 14/283,163, dated Sep. 30, 2014, 10 pages.

Final Office Action for U.S. Appl. No. 14/283,163, dated May 14, 2015, 13 pages.

Non-Final Office Action for U.S. Appl. No. 14/283,163, dated Sep. 4, 2015, 13 pages.

Final Office Action for U.S. Appl.No. 14/283,163, dated Jun. 15, 2016, 12 pages.

Notice of Allowance in U.S. Appl. No. 14/283,163, dated Jan. 19, 2017, 17 pages.

Non-Final Office Action in U.S. Appl. No. 15/462,753, dated May 11, 2017, 11 pages.

Final Office Action in U.S. Appl. No. 15/462,753, dated Sep. 15, 2017, 14 pages.

USPTO Examiner's Answer in U.S. Appl. No. 15/462,753, dated Jan. 24, 2019, 16 pages.

USPTO Patent and Trial Appeal Board Decision on Appeal in U.S. Appl. No. 15/462,753, mailed Aug. 25, 2020, 20 pages.

Rob Darby, "Internal Flow Applications," Chemical Engineering Fluid Mechanics, 2001, pp. 195-238, Chapter 7, Marcel Dekker, Inc., New York, NY.

John S. Scott, "Header" and "Manifold," Dictionary of Civil Engineering, 4th Edition, 1993, pp. 211 and 269, Van Nostrand Reinhold, New York, NY.

Petition for Inter Partes Review in *Asetek Danmark A/S v. CoolIT Systems, Inc.*, Mar. 26, 2020, Case IPR2020-00747.

Patent Owner's Preliminary Response in *Asetek Danmark A/S v. CoolIT Systems, Inc.*, Jul. 7, 2020, Case IPR2020-00747.

Petitioner's Reply to Patent Owner's Preliminary Response in *Asetek Danmark A/S v. CoolIT Systems, Inc.*, Jul. 24, 2020, Case IPR2020-00747.

Patent Owner's Sur-Reply in Support of Patent Owner's Preliminary Response in *Asetek Danmark A/S v. CoolIT Systems, Inc.*, Aug. 7, 2020, Case IPR2020-00747.

Institution Decision entered Oct. 2, 2020, Case IPR2020-00747.

(56) References Cited

OTHER PUBLICATIONS

Declaration of Donald E. Tilton, PH.D. in *Asetek Danmark A/S v. CoolIT Systems, Inc.*, Mar. 25, 2020, Case IPR2020-00747.
Petition for Inter Partes Review in *Asetek Danmark A/S v. CoolIT Systems, Inc.*, Apr. 10, 2020, Case IPR2020-00825.
Patent Owner's Preliminary Response in *Asetek Danmark A/S v. CoolIT Systems, Inc.*, Jul. 14, 2020, Case IPR2020-00825.
Petitioner's Reply to Patent Owner's Preliminary Response in *Asetek Danmark A/S v. CoolIT Systems, Inc.*, Jul. 31, 2020, Case IPR2020-00825.
Patent Owner's Sur-Reply in Support of Patent Owner's Preliminary Response in *Asetek Danmark A/S v. CoolIT Systems, Inc.*, Jul. 31, 2020, Case IPR2020-00825.
Institution Decision entered Oct. 13, 2020, IPR2020-00825.
Declaration of Donald E. Tilton, PH.D. in *Asetek Danmark A/S v. CoolIT Systems, Inc.*, Apr. 10, 2020, Case IPR2020-00825.
Non-Final Office Action for U.S. Appl. No. 15/912,478, dated Oct. 15, 2018, 6 pages.
Petition for Inter Partes Review in *Asetek Danmark A/S v. CoolIT Systems, Inc.*, Feb. 7, 2020, Case IPR2020-00524.
Patent Owner's Preliminary Response in *Asetek Danmark A/S v. CoolIT Systems, Inc.*, May 26, 2020, Case IPR2020-0524.
Petitioner's Reply to Patent Owner's Preliminary Response in *Asetek Danmark A/S v. CoolIT Systems, Inc.*, Jun. 5, 2020, Case IPR 2020-0524.
Patent Owner's Response in *Asetek Danmark A/S v. CoolIT Systems, Inc.*, Nov. 30, 2020, Case IPR2020-0524.
Institution Decision entered Aug. 24, 2020, Case IPR2020-00524.
Declaration of Donald E. Tilton, Ph.D. in *Asetek Danmark A/S v. CoolIT Systems, Inc.*, Nov. 30, 2020, Case IPR2020-0524.
Declaration of Robert F. McCauley in *Asetek Danmark A/S v. CoolIT Systems, Inc.*, Oct. 14, 2020, Case IPR2020-0524.
Declaration of Arpita Bhattacharyya in *Asetek Danmark A/S v. CoolIT Systems, Inc.*, May 26, 2020, Case IPR2020-0524.
Declaration of Joseph Rosselli, Q.C. in *Asetek Danmark A/S v. CoolIT Systems, Inc.*, May 23, 2020, Case IPR2020-0524.
Petition for Inter Partes Review in *Asetek Danmark A/S v. CoolIT Systems, Inc.*, Feb. 7, 2020, Case IPR2020-00523.
Patent Owner's Preliminary Response in *Asetek Danmark A/S v. CoolIT Systems, Inc.*, May 26, 2020, Case IPR2020-0523.
Petitioner's Reply to Patent Owner's Preliminary Response in *Asetek Danmark A/S v. CoolIT Systems, Inc.*, Jun. 5, 2020, Case IPR2020-0523.
Declaration of Joseph Rosselli, Q.C. in *Asetek Danmark A/S v. CoolIT Systems, Inc.*, May 23, 2020, Case IPR2020-0523.
Declaration of Arpita Bhattacharyya in *Asetek Danmark A/S v. CoolIT Systems, Inc.*, May 26, 2020, Case IPR2020-0523.
Declaration of Robert F. McCauley in *Asetek Danmark A/S v. CoolIT Systems, Inc.*, May 26, 2020, Case IPR2020-0523.
Patent Owner's Response in *Asetek Danmark A/S v. CoolIT Systems, Inc.*, Nov. 30, 2020, Case IPR2020-0523.
Declaration of John Hamill in *Asetek Danmark A/S v. CoolIT Systems, Inc.*, Nov. 25, 2020, Case IPR2020-0523.
Declaration of Donald E. Tilton, Ph.D. in *Asetek Danmark A/S v. CoolIT Systems, Inc.*, Nov. 30, 2020, Case IPR2020-0523.
Institution Decision entered Aug. 24, 2020, Case IPR2020-00523.
Centrifugal Pump Overview, Appendix B., http://nptel.ac.in/courses/112104117/ui/Course_home-8.htm , Jan. 5, 2018, pp. 1-10.
USPTO Patent Trail and Appeal Board Final Written Dicision in Case IPR2015-01276 dated Dec. 8, 2016.
USPTO Patent Trail and Appeal Board Decision of Institution of Inter Parties Review, filed Dec. 9, 2015 in Case IPR2015-01276.
Patent Owner's Response, filed Mar. 9, 2016 in Case IPR2015-01276.
Petition for Inter Parties Review of U.S. Pat. No. 8,746,330 in *Asetek Danmark A/S v. CoolIT Systems Inc.*, filed May 27, 2015.
Declaration of Dr. Donald Tilton (including his CV) from Petition fro Inter Parties Review of U.S. Pat. No. 8,746,330 in *Asetek Danmark A/S v. CoolIT Systems Inc.*, dated May 27, 2015.

Knight, et al., "Heat Sink Optimization with Application to Microchannels," IEEE Transactions on Components, Hybrids, and Manufacturing Technology, vol. 15, No. 5, Oct. 1992, pp. 832-842.
Kandlikar, "High Flux Heat Removal with Microchannels—A Roadmap of Challenges and Opportunities," Heat Transfer Engr'g. 26(8):5-14 (2005).
Steineke, Mark E., et al., "Single-Phase Heat Transfer Enhancement Techniques in Microchannel and Minichannel Flows," Michrochannels and Minichannels—Jun. 17-19, 2004, Rochester, New York, USA (2004).
Preissuance Submission dated Jan. 9, 2015, U.S. Appl. No. 13/401,618.
Examination Report dated Mar. 11, 2011 in European Application No. 07075014.6, 9 pages.
Technical Opinion with English Translation dated Jan. 10, 2013 in Japanese Registration No. 3179086 (Utility Model Application No. 2012-002117), 7 pages.
Search Report and Examination with English Translation for Taiwanese Application No. 101110072, dated Apr. 9, 2014, 40 pages.
Office Action for U.S. Appl. No. 12/189,476, dated Apr. 13, 2012, 17 pages.
Final Office Action for U.S. Appl. No. 12/189,476, dated Jan. 7, 2013, 10 pages.
Non-Final Office Action in U.S. Appl. No. 15/263,210, dated Feb. 10, 2017, 5 pages.
Non-Final Office Action in U.S. Appl. No. 13/401,618, dated Jul. 28, 2015, 20 pages.
Final Office Action in U.S. Appl. No. 13/401,618, dated Jan. 26, 2016, 23 pages.
Non-Final Office Action in U.S. Appl. No. 14/283,163, dated Sep. 30, 2014, 10 pages.
Final Office Action in U.S. Appl. No. 14/283,163, dated May 14, 2015, 15 pages.
Non-Final Office Action in U.S. Appl. No. 14/283,163, dated Sep. 4, 2015, 15 pages.
Examiner's Answer in U.S. Appl. No. 15/462,753, dated Jan. 24, 2019, 16 pages.
"WaterChill CPU Cooler Antarctica Pour Port Intel Socket 478, AMD Docket 462/754/939/940," Jun. 4, 2004 & Oct. 18, 2004, 10 pages, Version 4.0 & 4.1, Asetek, Inc.
CPU-360 Water Block (AMD/Intel Processor). Rev 1.1, Koolance, (https://koolance.com/cpu-360-processor-water-block) last accessed on Oct. 30, 2020, 1 page.
"Asetek WaterChill Antarctica Water Cooling Kit," Asetek, (https://www.extremeoverclocking.com/reviews/cooling/WaterChill_Antarctica_1.html) last accessed on Oct. 30, 2020, 11 pages.
Hilbert Hagedoom, "Aseteck Waterchill Watercooling—p. 1—a Chill Introduction," Guru3D.com, Feb. 28, 2005, 25 pages.
Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.
Matthew Homan, "WaterChill by Asetek," TechwareLabs, LLC, Dec. 11, 2004, (http://www.techwarelabs.com/reviews/cooling/asetek_waterchill/) last accessed on Oct. 30, 2020 3 pages.
3DGAMEMAN, "#530—Asetek WaterChill2 Water Cooling Kit," YouTube, Jul. 16, 2006, (https://www.youtube.com/watch?v=60XNAXO9cxY) last accessed on Oct. 30, 2020.
3DGAMEMAN, "#596—Asetek Xtreme WaterChill Water Cooling Kit," YouTube, Jul. 17, 2006, (https://www.youtube.com/watch?v=Z9XSJBCJttU) last accessed on Oct. 29, 2020.
Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.
Super1080P, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica for Intel Socket 478, AMD Socket A/754/940," Apr. 13, 2004, 14 pages, Version 4.0, Asetek, Inc.
"WaterChill CPU Cooler Antarctica for Intel Socket 478, AMD Socket 462/754/940," Jun. 4, 2004, 9 pages, Version 4.1, Asetek, Inc.

(56) References Cited

OTHER PUBLICATIONS

"WaterChill CPU Cooler Antarctica for Intel Socket 478, AMD Socket A/754/940," Mar. 30, 2004, 2 pages, Version 4.0, Asetek, Inc.

"WaterChill CPU Cooler Antarctica Pour Port Intel Socket 478, AMD Socket 462/754/940," Jun. 4, 2004, 10 pages, Version 4.0, Asetek, Inc.

"WaterChill CPU-Kühler Antarctica Für Intel Socket 478, AMD Socket 462/754/940," Jun. 4, 2004, 10 pages, Version 4.0, Asetek, Inc.

Refrigerador de CPUs WaterChill Antarctica Para Intel Socket 478, AMD Socket 462/754/940, Jun. 4, 2004, 9, pages, Version 4.0, Asetek, Inc.

"WaterChill CPU-Kühler Antarctica Für Intel Socket 478, AMD Socket 462/754/939/940," Jun. 4, 2004, & Oct. 18, 2004, 9 pages, Version 4.0 & 4.1, Asetek, Inc.

"WaterChill CPU Cooler Antarctica for Intel Socket 478, AMD Socket 462/754/939/940," Jun. 4, 2004 & Oct. 18, 2004, 9 pages, Version 4.0 & 4.1, Asetek, Inc.

"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.

Reexam Control No. No. 95/002,386, Decision on Appeal, Apr. 29, 2016, reh'g denied, Sep. 19, 2016.

Reexam Control No. 95/002,386, Right of Appeal Notice, Jun. 30, 2014, p. 3-4.

Claim Construction Order (Dkt. 149), 26-29, *Asetek A/S v. CoolIT Systems, Inc.*, 3:19-cv-00410-EMC, (N.D. Cal. Jul. 22, 2020), 45 pgs.

Patel, et al., "Computational Fluid Dynamics Modeling of High Compute Density Data Centers to Assure System Inlet Air Specifications", Proceedings of IPACK'01, Jul. 8-13, 2001; 9 pgs.

Filing Receipt mailed Aug. 21, 2007 for U.S. Appl. No. 60/954,987, filed Aug. 9, 2007.

Preliminary Amendment dated Nov. 6, 2007, p. 3, U.S. Appl. No. 11/919,974.

Preliminary Amendment dated Jan. 9, 2009, p. 4., U.S. Appl. No. 11/919,974.

Preliminary Amendment dated Mar. 10, 2011, p. 7, U.S. Appl. No. 11/919,974.

Preliminary Amendment dated Jul. 14, 2011, p. 8, U.S. Appl. No. 11/919,974.

Preliminary Amendment dated Jul. 14, 2011, "Marked-Up Copy of Substitute Specification," U.S. Appl. No. 11/919,974.

U.S. Appl. No. 13/269,234, Amendment, dated Apr. 6, 2012, p. 8-10.

U.S. Appl. No. 13/269,234, Notice of Allowability dated May 23, 2012, p. 2-3.

Office Action for U.S. Appl. No. 15/462,753, mailed Feb. 2, 2021.

Non-Final Office Action for U.S. Appl. No. 15/462,753, mailed May 3, 2023.

Final Office Action for U.S. Appl. No. 15/462,753, mailed Nov. 20, 2023.

Office Action for U.S. Appl. No. 17/079,225, mailed May 11, 2022.

Non-Final Office Action for U.S. Appl. No. 14/777,510, mailed Apr. 23, 2018, 23 pages.

Non-Final Office Action for U.S. Appl. No. 15/354,981, mailed May 8, 2018, 19 pages.

Non-Final Office Action for U.S. Appl. No. 15/351,362, mailed Nov. 18, 2018, 12 pages.

Notice of Allowance for U.S. Appl. No. 17/326,158, mailed Dec. 9, 2022.

Final Written Decision, Paper 50, *Asetek A/S v. CoolIT Systems, Inc.*, IPR2020-00825 (P.T.A.B. Oct. 12, 2021) (on appeal to CAFC, stipulated motion to withdraw appeal pending).

International Search Report and Writen Optinion for PCT Application No. PCT/IB2022/054242, mailed Aug. 27, 2022, 9 pages.

Corrected Declaration of Himanshu Pokharna, Ph.D., Exhibit 2038, *Asetek A/S v. CoolIT Systems, Inc.*, IPR2020-00825 (P.T.A.B. Oct. 12, 2021) (on appeal to CAFC, stipulated motion to withdraw appeal pending).

Declaration of Marc Hodges, Ph.D., Exhibit 2001, *Asetek A/S v. CoolIT Systems, Inc.*, IPR2020-00825 (P.T.A.B. Oct. 12, 2021) (on appeal to CAFC, stipulated motion to withdraw appeal pending).

"Asetek WaterChill" Techspot, Mar. 14, 2006 (https://www.techspot.com/community/topics/astek-waterchill.46119/), last accessed Sep. 30, 2021, 7 pages.

"Asetek Antarctica Waterblock" Overlookers, Feb. 28, 2004 (https://www.overclockers.com/astek-antarctica-waterblock/), last accessed Sep. 30, 2021, 6 pages.

"Asetek Antartica WaterChill CPU Cooling Kit Review" Overclocker Club, Feb. 28, 2004 (https://www.overclockerclubs.com/reviews/astek/5.htm), last accessed Sep. 30, 2021.

Ryszad Sommefeldt, "Review: Asetek WaterChill Antarctica KTL-L30," hexus.net, Aug. 2, 2004, 3 pages (https://m.hexus.net/tech/reviews/cooling/791-astek-waterchill-antarctica-l30/?page=2), last accessed Sep. 30, 2021.

"Asetek Reviews" TechPowerUp Review Database (https://www.techpowerup.com/reviewdb/-Cooling/Water/Astek), last accessed Sep. 30, 2021, 3 pages.

Non-Final Office Action for U.S. Appl. No. 17/079,225, mailed Nov. 28, 2023.

Steve Burke, NZXT Kraken X52, X62, & X42 Review & Benchmarks vs. H100iV2, Predator 280, Gamers Nexus (Oct. 29, 2016, 12:14 pm) https://www.gamersnexus.net/hwreviews/2662-nzxt-kraken-x52-x62-x42-review-and-benchmarks-noise-temp) last visited Jan. 5, 2023).

Garrett Carver, NZXT Kraken Z73 Review: Pretty, Pricey Performance, Tom's Hardware (Jan. 28, 2020), https://www.tomshardware.com/reviews/nzxt-kraken-z73 (last visited Jan. 5, 2023).

Rich Edmonds, NZXT Kraken Z63 and Z73 Review: Amazing AIO coolers with fancy LCD display, Windows Central (Jan. 28, 2020), https://www.windowscentral.com/nzxt-kraken-z63-z73-review (last visited Jan. 5, 2023).

Chad Sebring, ASUS ROG STRIC LC 120 RGB CPU Cooler Review, TweekTown (Aug. 20, 2020, 9:40 am CDT), https://www.tweaktown.com/reviews/9556/asus-rog-strix0lc-120-rgb-cpu-cooler-index.html (last visited Jan. 5, 2023).

Asetek 645LT 92 mm AIO: The small and famous cooler is back!, Glob3trotters, http://glob3trotters.com/portfolio/asetek-645lt-92-mm-aio:-the-small-and-famous-cooler-is-back (last visited Jan. 5, 2023).

NZXT Kraken Z73 Review: https://www.ocinside.de/review/nzxt_kraken_z73# (last visited Jan. 5, 2023).

"Adjacent" Merriam-Webster's Collegiate Dictionary, 10th ed. 2001, p. 14, Springfield, MA.

Viton# Flouroelastomers: High-Performance, available from www.viton.com/en/products (last visited: Jan. 5, 2023).

Vegas, et al., "Stiffness, Compliance, Resilience, and Creep Deformation: Understanding Implant-Soft Tissue Dynamics in the Augmented Breast: Fundamentals Based on Mateirals Science", Aesth Plast Surg 37: 922-930 (2013).

Merriam-Webster's Collegiate Dictionary (11th ed. 2011), 413, 765 (definitions of "mate" and "engage").

Zhang, et al. "Single Phase Liquid Cooled Microchannel Heat Sink for Electronic Packages," Applied Thermal Engineering 25, May 25, 2004.

Brazing Handbook (4th ed. 1991), American Welding Society, copyright 2002.

Shigley, et al. (eds.), "Standard Handbook of Machine Design," McGraw-Hill 2 ed. 1996.

Callister, Jr., et al. "Mechanical Propertiesof Metals," Materials Science and Engineering—An Introduction, Eighth Ed. 2010, pp. 150-196.

Ashby, et al., Engineering Materials 1: An Introduction Properties, Applications, and Design, Ch. 3:29-53, Ch. 8:115-133 (4th ed, 2012.

Concise Oxford English Dictionary (12th ed. 2011 ), 741 (definition of "interlock").

Petrie "Handbook of Adhesive and Sealants" Ch 1 (Introduction to Adhesive and Sealant), Ch 2 (Theories of Adhesion).

(56) References Cited

OTHER PUBLICATIONS

Smith, Mechanical Engineer's Reference Book, 12th ed., 1994, Section 16.4 (Adhesives), 19 pages.
Office Action for Taiwan Application No. 111118805, mailed Jan. 7, 2023, 4 pages.

* cited by examiner

FLUID HEAT EXCHANGE SYSTEMS

RELATED APPLICATIONS

This application claims the benefit of and priority to U.S. patent application Ser. No. 16/297,289, filed on Mar. 8, 2019, which is a continuation of U.S. patent application Ser. No. 15/912,478, filed on Mar. 5, 2018, which is a continuation of U.S. patent application Ser. No. 15/263,210, filed on Sep. 12, 2016, now U.S. Pat. No. 9,909,820, which is a continuation of U.S. patent application Ser. No. 13/401,618, filed on Feb. 21, 2012, now U.S. Pat. No. 9,453,691, which claims benefit of and priority to U.S. Provisional Patent Application No. 61/512,379, filed on Jul. 27, 2011, and is a continuation-in-part of U.S. patent application Ser. No. 12/189,476, filed on Aug. 11, 2008, now U.S. Pat. No. 8,746,330, which claims benefit of and priority to U.S. Provisional Patent Application No. 60/954,987, filed on Aug. 9, 2007, which applications are hereby incorporated by reference in their respective entireties, for all purposes.

BACKGROUND

The innovations and related subject matter disclosed herein (collectively referred to as the "disclosure") generally pertain to fluid heat exchange systems. Some systems are described in relation to electronics cooling applications by way of example, though the disclosed innovations may be used in a variety of other applications.

Fluid heat exchangers are used to cool electronic and other devices by accepting and dissipating thermal energy therefrom.

Fluid heat exchangers seek to dissipate to a fluid passing there through, thermal energy communicated to them from a heat source.

Despite the existence of many previously proposed fluid heat exchange systems, there remains a need for heat exchange systems configured to provide improved thermal performance. As well, there remains a need for systems configured for existing and developing small form factors, and more particularly. For example, there remains a need for low-profile heat exchange assemblies (e.g., integrated heat sink and pump assemblies) having a vertical component height of about 27 mm, such as between about 24 mm to about 27.5 mm, or less. There also remains a need for integrated components and systems having fewer fluid connections. In addition, there is a need for low-pressure-loss flow transitions in integrated heat exchange components.

SUMMARY

The innovations disclosed herein overcome many problems in the prior art and address the aforementioned, as well as other, needs. The innovations disclosed herein pertain generally to fluid heat exchange systems and more particularly, but not exclusively, to approaches for integrating components in such systems. For example, some innovations are directed to low-profile pump housings. Other innovations are directed to heat sink designs that deliver improved heat-transfer and/or pressure-loss performance. And other innovations are directed to approaches for eliminating system components while retaining their respective functions.

In accordance with a broad aspect of the innovations disclosed herein, there is provided a fluid heat exchanger comprising: a heat spreader plate including an intended heat generating component contact region; a plurality of microchannels for directing heat transfer fluid over the heat spreader plate, the plurality of microchannels each having a first end and an opposite end and each of the plurality of microchannels extending substantially parallel with each other microchannel and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening.

In accordance with another broad aspect of the disclosed innovations, there is provided a method for cooling a heat generating component comprising: providing a fluid heat exchanger including a heat spreader plate; a plurality of microchannels for directing heat transfer fluid over the heat spreader plate, the plurality of microchannels each having a first end and an opposite end and each of the plurality of microchannels having a continuous channel flow path between their first ends and their opposite ends; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends; mounting the heat spreader plate onto the heat generating component creating a heat generating component contact region where the heat generating component contacts the heat spreader plate; introducing a flow of heat exchanging fluid to the fluid heat exchanger; urging the flow of heat exchanging fluid through the fluid inlet into the plurality of microchannels first to a microchannel region between the ends of the microchannel; and, diverting the flow of heat exchanging fluid into a plurality of subflows that each flow away from the other, a first of the plurality of subflows flowing from the fluid inlet toward the first fluid outlet and a second of the plurality of subflows flowing from the fluid inlet toward the opposite fluid outlet.

According to another broad aspect of the disclosed innovations, heat exchange systems are disclosed.

Some described heat exchange systems have a heat sink with a plurality of juxtaposed fins defining a corresponding plurality of microchannels between adjacent fins, and a recessed groove extending transversely relative to the fins. A manifold body at least partially defines an opening generally overlying the groove.

The manifold body and the groove can together define a portion of an inlet manifold. The inlet manifold can be configured to hydraulically couple in parallel each of the microchannels to at least one other of the microchannels.

The heat sink can have a heat spreader, with each of the fins extending from the heat spreader. The fins and the heat spreader can form a unitary construction, in some heat sink embodiments. Each of the fins can define a corresponding distal edge spaced from the heat spreader, and the groove can be recessed from the respective plurality of distal edges. In some heat sink embodiments, a lowermost extent of the recessed groove is spaced from the heat spreader. In other heat sink embodiments, a lowermost extent of the recessed groove is substantially coextensive with the heat spreader. As described below, each of the respective distal edges can define a corresponding recessed portion, thereby defining the recessed groove.

In some embodiments, the recessed groove comprises a first groove positioned adjacent a first end of the fins and a second groove positioned adjacent a second, opposing end of the fins. For example, the first groove and the second groove can define respective portions of an exhaust manifold.

The cross-sectional profile of the recessed groove can have any of a variety of shapes. For example, in some heat sink embodiments, a cross-sectional profile of the recessed groove comprises a selected one or more of the group consisting of a v-shaped notch, a semi-circle, a parabola, a hyperbola, and a notch having at least one substantially straight edge.

In some heat sink embodiments, a ratio of a representative height of the plurality of fins to a representative depth of the groove is between about 10:1 and about 10:7. For example, the ratio of the representative height to the representative depth can be between about 3:1 and about 2:1.

The opening in the manifold body can have a recessed region and an aperture extending through the manifold body from the recessed region. In some instances, the recessed region in the manifold body is a tapered recessed region having at least one cross-sectional dimension that diminishes with increasing depth of the recessed region. A slope of the recessed groove adjacent the manifold body can be substantially continuous with a slope of the recessed region in the manifold body adjacent the groove. The recessed region, the aperture and the groove can together define a flow transition having a characteristic length scale between about 150% and about 200% greater than a corresponding characteristic length scale of the aperture.

In some heat exchange systems of the type described herein, the inlet manifold can be configured to deliver a flow of a fluid to each of the microchannels in a transverse direction relative to a longitudinal axis of the respective microchannels. Some heat exchange systems have q body defining an inlet plenum. The inlet plenum and the inlet manifold can together be configured to deliver a fluid flow to in a direction generally transverse to the fins. For example, the inlet manifold can be configured to deliver an impingement flow of the fluid to each of the microchannels.

In some heat sink embodiments, each of the fins in the plurality of fins defines a corresponding beveled distal edge.

Some heat exchange systems also have a unitary body defining a first side and a second side positioned opposite the first side. A portion of the inlet plenum and a portion of the inlet manifold can be respectively recessed from the first side. A recess from the second side can define a pump volute, and the portion of the inlet plenum recessed from the first side can be positioned adjacent the pump volute. The recess defining the pump volute can be a substantially cylindrically-shaped recess having a longitudinal axis extending substantially perpendicularly to the second side. The unitary body can define an opening extending generally tangentially of the cylindrically-shaped recess and hydraulically couple the pump volute to the inlet plenum.

The body can define a second recessed region adjacent the inlet manifold recess and a wall separating the second recessed region from the inlet manifold recess. The manifold body can be configured to straddle the inlet manifold recess and matingly engage the body such that the manifold body so occupies a portion of the second recessed region as to define an exhaust manifold that generally overlies a respective portion of each of the microchannels. The respective portions of the plurality of microchannels can be spaced from the inlet manifold.

In accordance with yet another broad aspect of the disclosed innovations, some described heat exchange systems have a heat sink with a plurality of juxtaposed fins defining a corresponding plurality of microchannels between adjacent fins. Each of the fins can define a respective beveled distal edge. A manifold body can overlie at least a portion of each of the beveled distal edges and define an opening configured to deliver a flow of fluid to the microchannels in a direction transverse to the microchannels.

A distance between a respective beveled distal edge and the heat spreader can define a height of the respective fin. Each respective fin can define a first end and a second end, and extend longitudinally in a spanwise direction relative to the heat spreader between the first and the second end. The respective fin height of one or more of the plurality of fins can vary along the spanwise direction. The manifold body can have a compliant portion urging against at least a portion of each of the distal edges. For example, the variation in fin height along the spanwise direction can define a non-linear contour of the respective distal edge, and the compliant portion of the manifold body can generally conform to the non-linear contour.

A recessed groove can extend transversely relative to the fins and the opening can generally overlie the groove. Each of the respective distal edges can define a corresponding recessed portion, thereby defining the recessed groove.

A ratio of a representative height of the plurality of fins to a representative depth of the groove can be between about 10:1 and about 10:7. For example, the ratio of the representative height to the representative depth can be between about 3:1 and about 2:1.

According to another broad aspect of the disclosed innovations, unitary constructs are described. For example, a unitary construct can have a first side, a second side positioned opposite the first side, and a substantially continuous perimeter wall extending between the first side and the second side. A floor can generally separate the first side from the second side. The first side can define a substantially cylindrically-shaped recess and the second side can define a recess having a region positioned radially outward of the substantially cylindrically-shaped recess defined by the first side.

In some instances, the unitary construct can define an aperture extending between the substantially cylindrically-shaped recess and the portion of the recess from the second side positioned radially outward of the substantially cylindrically-shaped recess.

The perimeter wall can define one or more perimeter recesses. The construct can define an aperture in the floor extending between one of the perimeter recesses and the substantially cylindrically-shaped recess. The construct can define an aperture extending between one of the perimeter recesses and the recess defined by the second side. The construct can define an aperture extending between one of the perimeter recesses and the portion of the recess from the second side positioned radially outward of the substantially cylindrically-shaped recess.

The one or more perimeter recesses can include a first perimeter recess and a second perimeter recess. The construct can define an aperture extending between the second perimeter recess and the recess defined by the second side. The perimeter wall can also define a third perimeter recess and the construct can define an aperture extending between the third perimeter recess and the portion of the recess from the second side positioned radially outward of the substantially cylindrically-shaped recess.

Some embodiments of the construct generally define a housing. The substantially cylindrically-shaped recess can define a pump volute, and the recess from the second side can define a plenum. The plenum can be a heat sink inlet plenum defined by the portion of the recess from the second side positioned radially outward of the substantially cylindrically-shaped recess. The recess from the second side can define a portion of a heat-sink inlet manifold, a portion of a heat-sink outlet manifold, and a portion of a heat-sink outlet manifold.

It is to be understood that other innovative aspects will become readily apparent to those skilled in the art from the following detailed description, wherein various embodiments are shown and described by way of illustration. As will be realized, other and different embodiments are possible and several details are capable of modification in various other respects, all without departing from the spirit and scope of the principles disclosed herein.

Accordingly the drawings and detailed description are to be regarded as illustrative in nature and not as restrictive.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several aspects of the presently disclosed principles are illustrated by way of example, and not by way of limitation, in detail in the drawings, wherein.

DETAILED DESCRIPTION

The following describes various innovative principles related to heat exchange systems by way of reference to specific examples. However, one or more of the disclosed principles can be incorporated in various system configurations to achieve any of a variety of corresponding system characteristics. The detailed description set forth below in connection with the appended drawings is intended as a description of various embodiments and is not intended to represent the only embodiments contemplated by the inventor. The detailed description includes specific details for the purpose of providing a comprehensive understanding of the principles disclosed herein. However, it will be apparent to those skilled in the art after reviewing this disclosure that one or more of the claimed inventions may be practiced without one or more of the illustrated details.

Stated differently, systems described in relation to particular configurations, applications, or uses, are merely examples of systems incorporating one or more of the innovative principles disclosed herein and are used to illustrate one or more innovative aspects of the disclosed principles. Thus, heat exchange systems having attributes that are different from those specific examples discussed herein can embody one or more of the innovative principles, and can be used in applications not described herein in detail, for example to transfer heat to or from components in a data center, laser components, light-emitting diodes, chemical reactions, photovoltaic cells, solar collectors, electronic components, power electronics, opto-electronics (e.g., used in switches) and a variety of other industrial, military and consumer devices now known or hereafter developed. Accordingly, such alternative embodiments also fall within the scope of this disclosure.

Fluid Circuit

Figure 1:
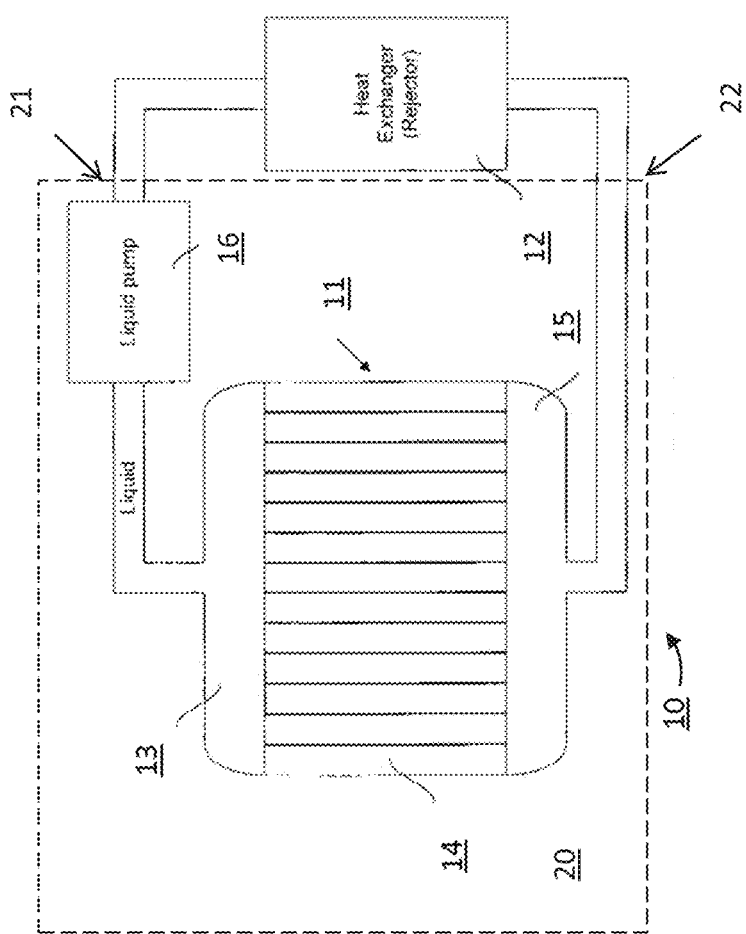
FIG. 1 shows a fluid circuit configured to transfer heat from one region to another with a circulatable working fluid.

The schematic illustration in FIG. 1 shows several functional features common among disclosed fluid-based heat exchanger systems. For example, the fluid circuit 10 has a first heat exchanger 11 configured to absorb heat from a heat source (not shown in FIG. 1) and a second heat exchanger 12 configured to reject heat from the circuit 10. As indicated in FIG. 1, a working fluid, or coolant, can circulate between the heat exchangers 11, 12 to carry the energy absorbed by the working fluid in the first heat exchanger to the second heat exchanger 12 where energy can be rejected from the fluid. One or both of the heat exchangers 11, 12 can be a microchannel heat exchanger.

As used herein, "microchannel" means a fluid conduit, or channel, having at least one major dimension (e.g., a channel width) measuring less than about 1 mm, such as, for example, about 0.1 mm, or several tenths of millimeters.

As used herein, "fluidic" means of or pertaining to a fluid (e.g., a gas, a liquid, a mixture of a liquid phase and a gas phase, etc.). Thus, two regions that are "fluidically coupled" are so coupled to each other as to permit a fluid to flow from one of the regions to the other region in response to a pressure gradient between the regions.

As used herein, the terms "working fluid" and "coolant" are interchangeable. Although many formulations of working fluids are possible, common formulations include distilled water, ethylene glycol, propylene glycol, and mixtures thereof.

As used herein, the terms "heat sink" and "heat exchanger" are interchangeable and mean a device configured to transfer energy to or from a fluid through convection (i.e., a combination of conduction and advection) heat transfer.

Referring again to FIG. 1, the working fluid typically enters a first manifold 13 (sometimes after passing through an inlet plenum, which is omitted from FIG. 1 for ease of illustration). From the manifold 13, the fluid can be distributed among a plurality of fluid passages 14 configured to transfer heat from a heat-transfer surface, e.g., a wall in the heat exchanger 11, to the working fluid. In some embodiments, such as the examples described below, the fluid passages 14 are configured as microchannels and the walls are configured as extended heat-transfer surfaces, or fins.

During operation of the circuit 10, energy conducts (e.g., diffuses) from the walls of the first heat exchanger into adjacent fluid particles within the passages 14, and the adjacent fluid particles are swept away from the wall, or advected, carrying the energy absorbed from the walls. The swept-away particles are replaced by other, usually cooler fluid particles, which more readily absorb energy from the walls (e.g., by virtue of their usually lower temperature). Such a combination of conduction and advection (i.e., convection) provides an efficient approach for cooling devices having a relatively high heat flux, such as, for example, electronic devices.

After passing through the plurality of passages 14 in the first heat exchanger 11, the heated working fluid collects in an exhaust manifold 15 and passes to the second heat exchanger 12, carrying with it the energy absorbed from the first heat exchanger 11. As the heated fluid passes through the second heat exchanger 12, energy is rejected from the fluid (e.g., to another working fluid, such as, for example, the air or a building's water supply) through convection processes similar to those described above. From the second heat exchanger, the cooled working fluid passes through a pump 16 and back to the first heat exchanger 11.

The dashed box in FIG. 1 indicates that several functional components of the circuit 10 can be integrated into a single subassembly. As an example, the subassembly 20 includes the pump 16, the manifolds 13, 15 and the passages 14, as well as, for example, conduits between the pump and the manifold 13. An inlet 21 and an outlet 22 operatively couple the subassembly 20 to the second heat exchanger 12. A working embodiment of such a subassembly 20 is described below in connection with FIG. 7, et seq.

Each of the innovative features described herein can be incorporated, either singly or in combination, in connection with the first heat exchanger 11, the second heat exchanger 12, or both.

Heat Exchanger Example

Figure 2:
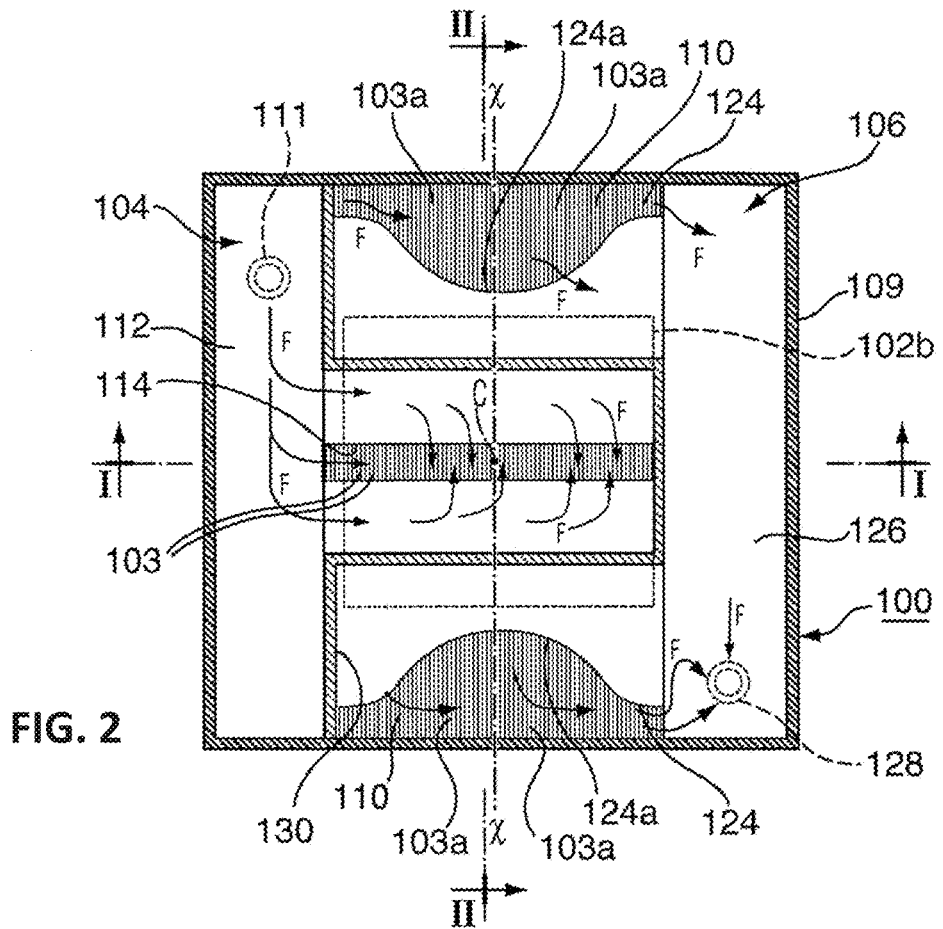
FIG. 2 shows a top plan view of a fluid heat exchanger having a top cap cut away to facilitate viewing internal components.
Figure 3:
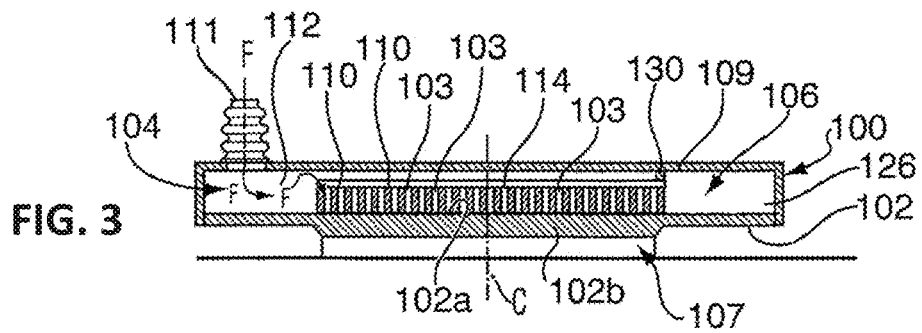
FIG. 3 shows a sectional view along line I-I of FIG. 2.
Figure 4:
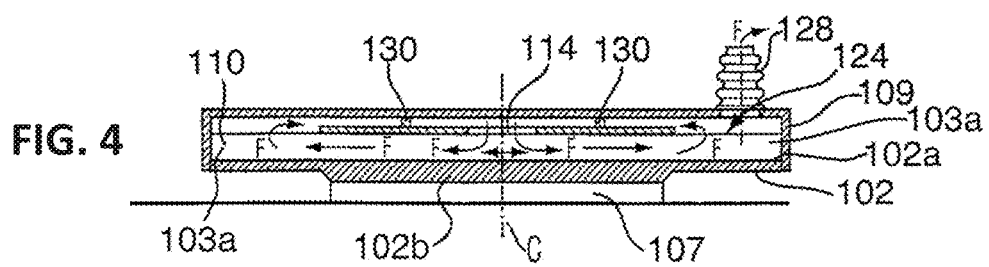
FIG. 4 shows a sectional view along line II-II of FIG. 3.

With reference to FIGS. 2 to 4, a fluid heat exchanger 100 is shown. Fluid heat exchanger 100 includes a heat spreader plate 102, an arrangement of fluid microchannels 103 defined between walls 110, a fluid inlet passage 104, and a fluid outlet passage 106. A housing 109 operates with heat spreader plate 102 to form an outer limit of the heat sink and to define fluid flow passages 104, 106.

As shown in FIGS. 3 and 4, in use the heat exchanger 100 is coupled to a heat source 107, such as an electronic device, including, but not limited to a microchip or an integrated circuit. The heat exchanger may be thermally coupled to the heat source by a thermal interface material disposed therebetween, by coupling directly to the surface of the heat source, or by integrally forming the heat source and at least the heat spreader plate 102 of the fluid heat exchanger. The heat exchanger 100 may take various forms and shapes, but heat spreader plate 102 is formed to accept thermal energy from heat source 107. Heat spreader plate 102 includes an intended heat generating component contact region 102b positioned in a known location thereon. In the illustrated embodiment, heat spreader plate 102 includes a protrusion at region 102b that controls the positioning of the heat spreader plate relative to the heat source, but such a protrusion need not be included. Heat spreader plate 102 may include a portion of more conductive material to facilitate and control heat transfer, if desired. In any event, heat spreader plate is formed to fit over and thermally communicate with a heat source in a region 102b, usually located centrally relative to the edges of the heat spreader plate.

Microchannels 103 are formed to accept and allow passage therethrough of the flow of heat exchanging fluid such that the fluid can move along heat spreader plate 102 and walls 110 and accept and dissipate heat energy from them. In the illustrated embodiment, microchannels 103 are defined by walls 110 that are thermally coupled to the heat spreader plate to accept thermal energy therefrom. For example, heat spreader plate 102 may include an inner facing, upper surface 102a and a plurality of microchannel walls 110 may extend upwardly therefrom, whereby the channel area, defined between upper surface 102a and the microchannel walls 110, channels or directs fluid to create a fluid flow path. The channel area may be open or filled with thermally conductive porous material such as metal or silicon foam, sintered metal, etc. Thermally conductive, porous materials allow flow through the channels but create a tortuous flow path.

Surface 102a and microchannel walls 110 allow the fluid to undergo exchange of thermal energy from the heat spreader plate to cool the heat source coupled to the heat spreader plate. The upper surface 102a and walls 110 have a high thermal conductivity to allow heat transfer from the heat source 107 to fluid passing through channels 103. The surfaces forming channels 103 may be smooth and solid, formed with a porous structure, such as of sintered metal and/or metal or silicon foam or roughened, for example, including troughs and/or crests designed to collect or repel fluid from a particular location or to create selected fluid flow properties. Facing microchannel walls 110 may be configured in a parallel configuration, as shown, or may be formed otherwise, provided fluid can flow between the microchannel walls 110 along a fluid path. It will be apparent to one skilled in the art that the microchannel walls 110 may be alternatively configured in any other appropriate configuration depending on various factors of desired flow, thermal exchange, etc. For instance, grooves may be formed between sections of microchannel walls 110. Generally, microchannel walls 110 may desirably have dimensions and properties which seek to reduce or possibly minimize the pressure drop or differential of fluid flowing through the channels 103 defined therebetween.

The microchannel walls 110 may have a width dimension within the range of 20 microns to 1 millimeter and a height dimension within the range of 100 microns to five millimeters, depending on the power of the heat source 107, desired cooling effect, etc. The microchannel walls 110 may have a length dimension which ranges between 100 microns and several centimeters, depending on the dimensions of, and the heat flux density from, the heat source. In one embodiment, the walls 110 extend the full length (which may be a width) dimension of the heat spreader plate passing fully through region 102*b*. These are exemplary dimensions and, of course, other microchannel wall dimensions are possible. The microchannel walls 110 may be spaced apart by a separation dimension range of 20 microns to 1 millimeter, depending on the power of the heat source 107, although other separation dimensions are contemplated.

Other microporous channel configurations may be used alternatively to, or together with, microchannels, such as for example, a series of pillars, fins, or undulations, etc. which extend upwards from the heat spreader plate upper surface or tortuous channels as formed by a foam or sintered surface.

Fluid heat exchanger 100 further includes a fluid inlet passage 104, which in the illustrated embodiment includes a port 111 through the housing opening to a header 112 and thereafter a fluid inlet opening 114 to the microporous fluid channels 103.

Fluid Distribution

The port and the header can be formed in various ways and configurations. For example, port 111 may be positioned on top, as shown, side or end regions of the heat exchanger, as desired. Port 111 and header 112 are generally of a larger cross sectional area than opening 114, so that a mass flow of fluid can be communicated substantially without restriction to opening 114.

Although only a single fluid inlet opening 114 is shown, there may be one or more fluid inlet openings providing communication from the header to the fluid microchannels 103.

Fluid inlet opening 114 may open to microchannels 103 opposite the heat spreader plate such that fluid passing through the opening may pass between walls 110 toward surface 102*a*, before being diverted along the axial length of the channels, which extend parallel to axis x. Since most installations will position the heat spreader plate as the lowermost, as determined by gravity, component of heat exchanger 100, the fluid inlet openings 114 can generally be described as being positioned above the microchannels 103 such that fluid may flow through opening 114 down into the channels in a direction orthogonal relative to the plane of surface 102*a* and towards surface 102*a* and then change direction to pass along the lengths of channels 103 substantially parallel to surface 102*a* and axis x. Such direction change is driven by impingement of fluid against surface 102*a*.

Fluid inlet opening 114 may be positioned adjacent to the known intended heat generating component contact region 102*b* since this region of the heat spreader plate may be exposed to greater inputs of thermal energy than other regions on plate 102. Positioning the fluid inlet opening adjacent region 102*b* seeks to introduce fresh heat exchanging fluid first and directly to the hottest region of the heat exchanger. The position, arrangement and/or dimensions of opening 114 may be determined with consideration of the position of region 102*b* such that opening 114 may be placed adjacent, for example orthogonally opposite to, or according to the usual mounting configuration above, the intended heat generating component contact region 102*b* on the heat plate. The delivery of fresh fluid first to the region that is in direct communication with the heat generating component to be cooled seeks to create a uniform temperature at the contact region as well as areas in the heat spreader plate away from the contact region.

In the illustrated embodiment, opening 114 is positioned to have its geometric center aligned over the center, for example the geometric center, of region 102*b*. It is noted that it may facilitate construction and installation by intending, and possibly forming, the heat sink spreader plate to be installed with the heat generating component positioned on the plate substantially centrally, with respect to the plate's perimeter edges, and then opening 114 may be positioned also with its geometric center substantially centrally with respect to the perimeter edges of the heat spreader plate. In this way, the geometric center points of each of opening 114, the heat spreader plate and the heat generating component may all be substantially aligned, as at C.

Opening 114 may extend over any channel 103 through which it is desired that heat exchange fluid flows. Openings 114 may take various forms including, for example, various shapes, various widths, straight or curved edges (in plane or in section) to provide fluid flow features, open area, etc., as desired.

Heat exchanger 100 further includes a fluid outlet passage 106, which in the illustrated embodiment includes one or more fluid outlet openings 124 from the microporous fluid channels 103, a header 126 and an outlet port 128 opening from the housing. Although two fluid outlet openings 124 are shown, there may be one or more fluid outlet openings providing communication to the header from the fluid channels 103.

The port and the header can be formed in various ways and configurations. For example, port 128 may be positioned on top, as shown, side or end regions of the heat exchanger, as desired.

Fluid outlet openings 124 may be positioned at the end of microchannels 103. Alternately or in addition, as shown, fluid outlet openings 124 may create an opening opposite heat spreader plate 102 such that fluid passing through the channels pass axially along the length of the channels between walls 110 and then changes direction to pass away from surface 102*a* out from between the walls 110 to exit through openings 124. Since most installations will position the heat spreader plate as the lowermost, as determined by gravity, component of heat exchanger 100, the fluid outlet openings 124 will generally be positioned above the microchannels 103 such that fluid may flow from the channels upwardly through openings 124.

Fluid outlet openings 124 may be spaced from fluid inlet openings 114 so that fluid is forced to pass through at least a portion of the length of channels 103 where heat exchange occurs before exiting the microchannels. Generally, fluid outlet openings 124 may be spaced from the known intended heat generating component contact region 102*b*.

In the illustrated embodiment, where heat exchanger 100 is intended to be mounted with heat source 107 generally centrally positioned relative to the perimeter edges of heat spreader plate 102, and thereby the ends 103a of channels, openings 124 may be positioned at or adjacent channel ends 103a.

At least one opening 124 extends over any channel 103 through which it is desired that heat exchange fluid flows. Openings 124 may take various forms including, for example, various shapes, various widths, straight or curved edges (in plane or in section) to provide fluid flow features, open area, etc. as desired.

Fluid inlet opening 114 may open away from the ends of the microchannels, for example along a length of a microchannel between its ends. In this way, fluid is introduced to a middle region of a continuous channel 103 rather than fluid being introduced to one end of a channel and allowing it to flow the entire length of the channel. In the illustrated embodiment, heat exchanger 100 is intended to be mounted with heat source 107 generally centrally positioned relative to the perimeter edges of heat spreader plate 102. As such, in the illustrated embodiment, opening 114 is positioned generally centrally relative to the edges of the heat plate 102. Since the channels, in the illustrated embodiment extend substantially continuously along the length of the heat plate between opposing side perimeter edges thereof, opening 114 opens generally centrally between ends 103a of each channel. For example, opening 114 may be positioned in the middle 50% of the heat exchanger or possibly the middle 20% of the heat exchanger. The delivery of fresh fluid to the central region where the heat generating component is in direct communication with the heat spreader plate, first before passing through the remaining lengths of channels seeks to create a uniform temperature at region 102b as well as areas in the heat spreader plate adjacent to the intended mounting position. The introduction of fluid to a region along a middle region of the microchannels after which the flow splits into two sub flows to pass outwardly from the inlet towards a pair of outlets, each of which is positioned at the ends of the channels reduces the pressure drop of fluid passing along the channels over that pressure drop that would be created if the fluid passed along the entire length of each channel. Splitting the fluid flow to allow only approximately one half of the mass inlet flow to pass along any particular region of the microchannels creates less back pressure and less flow resistance, allows faster fluid flow through the channels and lessens the pump force required to move the fluid through the heat exchanger.

In use, heat spreader plate 102 is positioned in thermal communication with heat source 107 at region 102b. Heat generated by heat source 107 is conducted up through heat spreader plate 102 to surface 102a and walls 110. Heat exchanging fluid, as shown by arrows F, enters the fluid heat exchanger through port 111, passes into the header 112 and through opening 114. The heat exchanging fluid then passes down between walls 110 into channels 103, where the fluid accepts thermal energy from the walls 110 and surface 102a. The heat exchanging fluid, after passing down into the channels, then impinges against surface 102a to be diverted toward ends 103a of the channels toward outlet openings 124. In so doing, in the illustrated embodiment, the fluid is generally split into two subflows moving away from each other and away from inlet 114 toward openings 124 at the ends of the microchannels. Fluid passing through channels becomes heated, especially when passing over the region in direct contact with the heat source, such as, in the illustrated embodiment, the central region of the heat spreader plate. Heated fluid passes out of openings 124, into header and thereafter through port 128. The heated fluid will circulate through a heat sink where its thermal energy is unloaded before circulating back to port 111.

The individual and relative positioning and sizing of openings 114 and 124 may allow fluid to circulate through the heat exchanging channels 103 while reducing the pressure drop generated in fluid passing through heat exchanger 100, when compared to other positionings and sizings. In the illustrated embodiment, for example, the central region 124a of outlet openings 124 are scalloped to offer an enlarged outlet region from the centrally located channels, relative to those on the edges. This shaping provides that the outlet openings from some centrally positioned channels 103, relative to the sides of the heat exchanger, are larger than the outlet openings from other channels closer to the edges. This provides that fluid flowing through the more centrally located channels encounters less resistance to flow therethrough, again facilitating flow past the central mounting region 102b on heat spreader plate 102.

A seal 130 separates fluid inlet passage 104 from fluid outlet passage 106 so that fluid must pass through the microporous channels 103 past heat spreader plate surface 102a.

Methods of Manufacture

Figure 6:
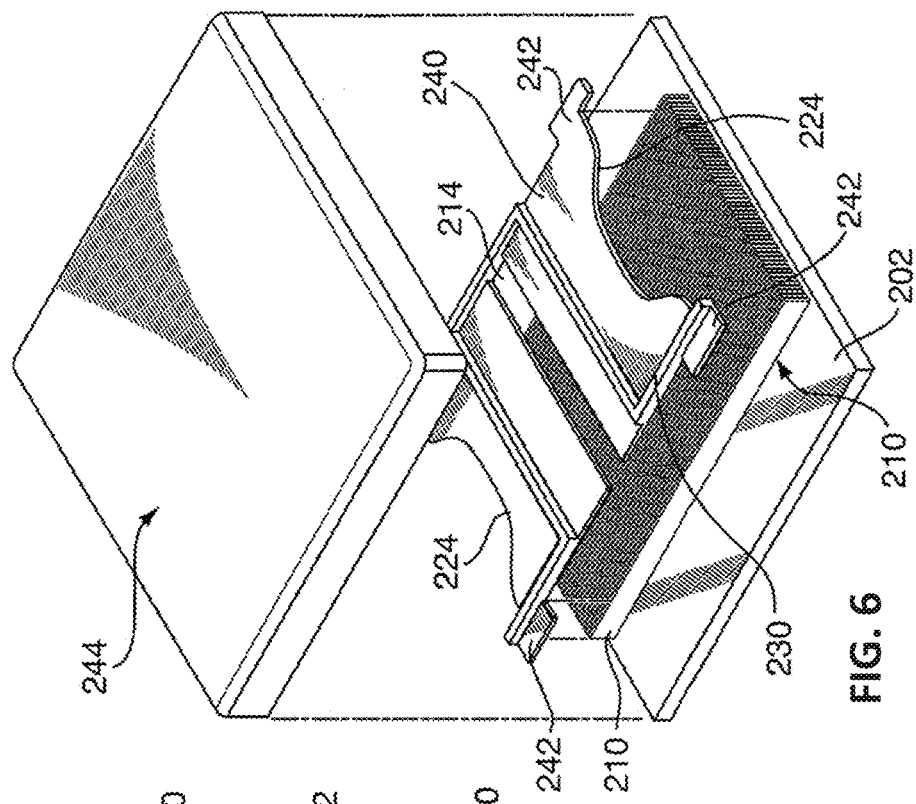
FIG. 6 shows a top plan view of the fluid heat exchanger shown in FIG. 5 assembled with its top cap removed.
Figure 5:
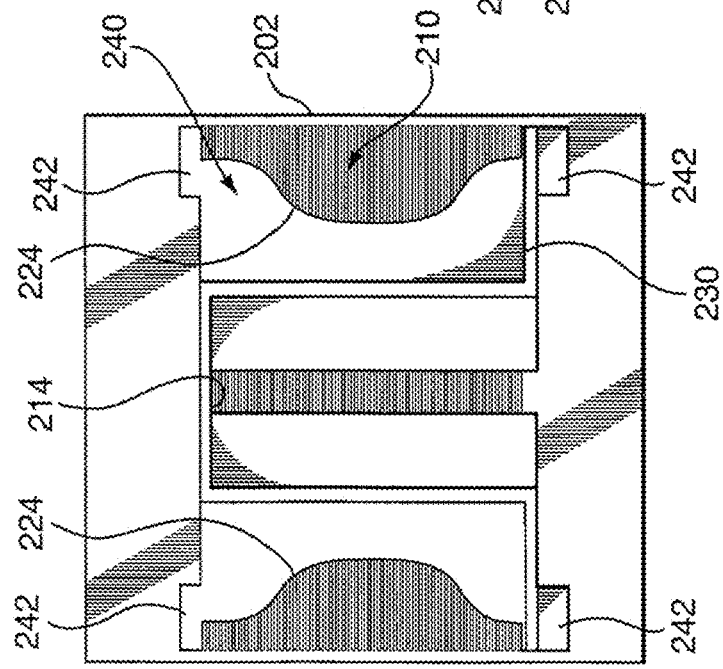
FIG. 5 shows an exploded, perspective view of another fluid heat exchanger.

With reference to FIGS. 5 and 6, a useful method for manufacturing a fluid heat exchanger is described. A heat spreader plate 202 may be provided which has heat conductive properties through its thickness at least about a central region thereof.

Microchannels may be formed on the surface of the heat spreader plate, as by adding walls or forming walls by building up or removing materials from the surface of the heat plate. In one embodiment, skiving is used to form walls 210.

A plate 240 may be installed over the walls 210 to close off the channels across the upper limits of walls 210. Plate 240 has portions removed to create inlet and outlet openings 214 and 224, respectively, in the final heat exchanger. Tabs 242 may be used to assist with the positioning and installation of plate 240, wherein tabs 242 are bent down over the two outermost walls.

Seal 230 may be installed as a portion of plate 240 or separately.

After plate 240 and seal 230 are positioned, a top cap 244 can be installed over the assembly. Top cap 244 can include side walls that extend down to a position adjacent heat spreader plate. The parts may be connected during assembly thereof or afterward by overall fusing techniques. In so doing, the parts are connected so that short circuiting from inlet passage to outlet passage is substantially avoided, setting up the fluid circuit as described herein above wherein the fluid flows from opening 214 to openings 224 through the channels defined between walls 210.

System Integration

Figure 7:
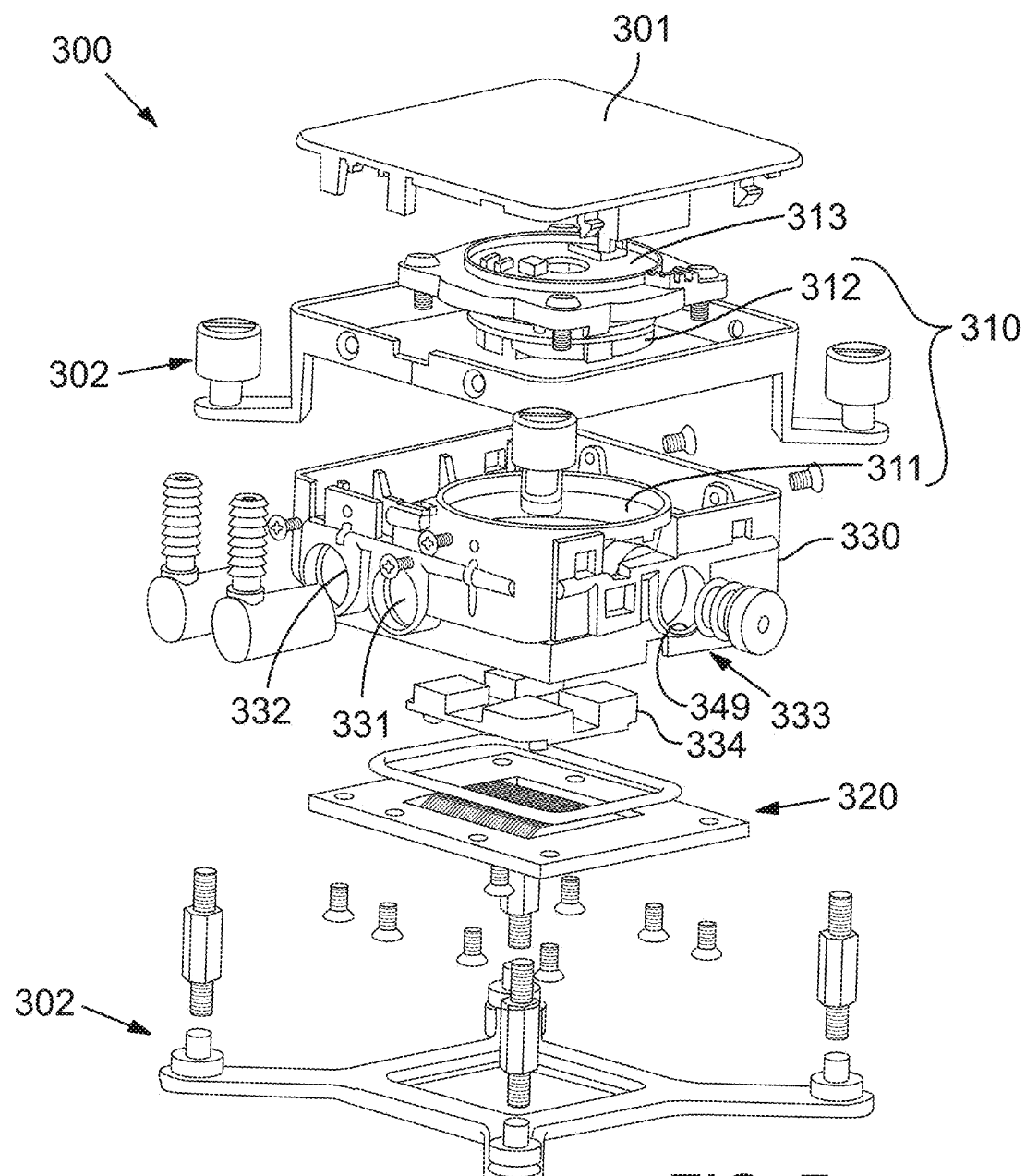
FIG. 7 illustrates an exploded view of an embodiment of an integrated pump and heat exchanger assembly.

Referring now to FIG. 7, a working example of an integrated subassembly 20 (FIG. 1) is described. The illustrated subassembly 300 comprises a pump 310 (e.g., 312 and 313, exclusive of retention mechanism 302) and a heat exchanger 320, as well as housing 330 with integrated fluid conduits extending therebetween. The subassembly 300 is but one example of an approach for integrating several elements of the fluid circuit 10 shown in FIG. 1 (e.g., the pump 16 and the first heat exchanger 11, including the inlet manifold 13, the fluid passages 14, the exhaust manifold 15) into a single element while retaining the several elements' respective functions. The illustrated housing 330 is configured to convey a working fluid from an inlet port 331 to a pump volute 311, from the pump volute to an inlet 321 (FIG.

11) to the heat exchanger 320, and from an outlet 322 (FIG. 11) of the heat exchanger to an outlet port 332.

The pump impeller 312 can be received in the pump volute 311. The impeller can be driven in rotation by an electric motor 313 in a conventional manner. A cap 301 can overlie the motor 313 and fasten to the housing 330 to provide the subassembly 300 with a finished appearance suitable for use with, for example, consumer electronics.

The side 333 of the housing 330 positioned opposite the pump volute 311 can receive an insert 334 and the heat exchanger 320. A seal (e.g., an O-ring) 323 can be positioned between the housing 330 and the heat exchanger 320 to reduce and/or eliminate leakage of the working fluid from the interface between the heat exchanger 320 and the housing 330.

The heat exchanger 320 defines a lower-most face of the assembly 300, as well as a surface configured to thermally couple to an integrated circuit (IC) package (not shown). A retention mechanism 302 can mechanically couple the assembly to a substrate, such as a printed circuit board to which the IC package is assembled.

As with the subassembly 20 shown in FIG. 1, a fluid conduit, or other fluid coupler, can fluidicly couple an outlet port of a remotely positioned heat exchanger to the inlet port 331 of the housing 330. As well, a fluid conduit, or other fluid coupler, can fluidicly couple the outlet port 332 of the housing 330 to an inlet port of the remotely positioned heat exchanger. In a cooling application, the respective fluid conduits convey relatively higher-temperature fluid from the outlet port 332 to the remote heat exchanger and relatively lower-temperature fluid from the remote heat exchanger to the inlet port 331.

Integrated Housing

An embodiment of a unitary housing 330 is now described by way of reference to FIGS. 7, 8, 9, 10 and 11. The illustrated housing 330 has a first side 340, a second side 333 positioned opposite the first side, and a substantially continuous perimeter wall 348 extending between the first side and the second side. A floor, or lower wall, 341 (FIG. 9) generally separates the first side from the second side. The opposed first side 340 and second side 333 define respective recessed features that, when combined with corresponding components, define integrated fluid conduits and chambers operable to convey a working fluid within a small form factor (e.g., within a volume having a maximum vertical dimension of less than about 1.5 inches, such as, for example, between about 0.75 inches and about 1.4 inches).

For example, the housing has an inlet port 331, a pump volute 311, an inlet plenum 335 (FIG. 10), an inlet manifold portion 336 corresponding to the inlet plenum, an exhaust manifold portion 337, an exhaust (or outlet) plenum 338 corresponding to the exhaust manifold portion, and an outlet port 332 fluidicly coupled with each other.

Figure 8:
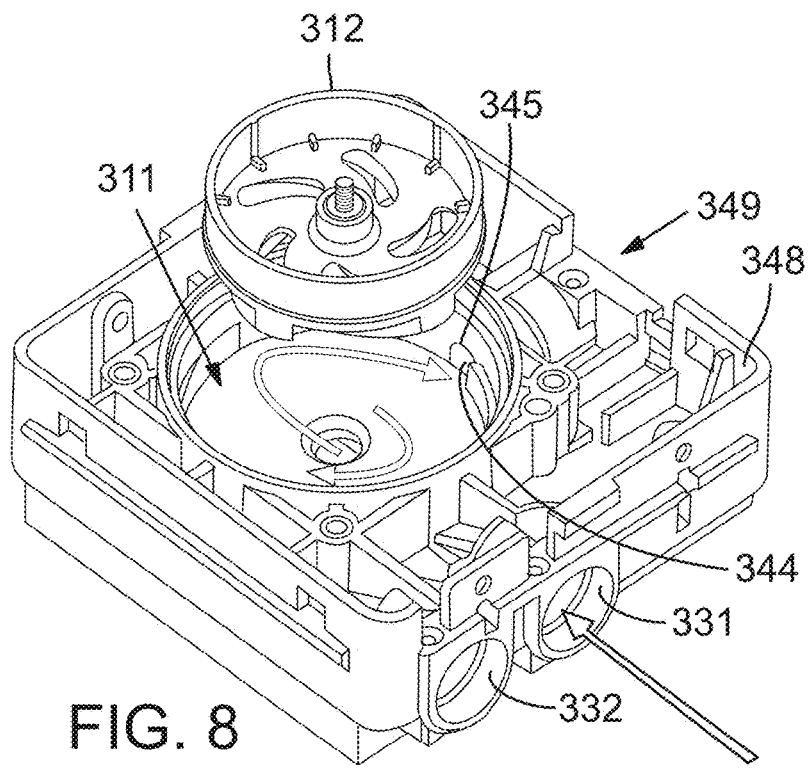
FIG. 8 illustrates an isometric view of an exploded subassembly of the integrated housing and pump impeller shown in FIG. 7.
Figure 9:
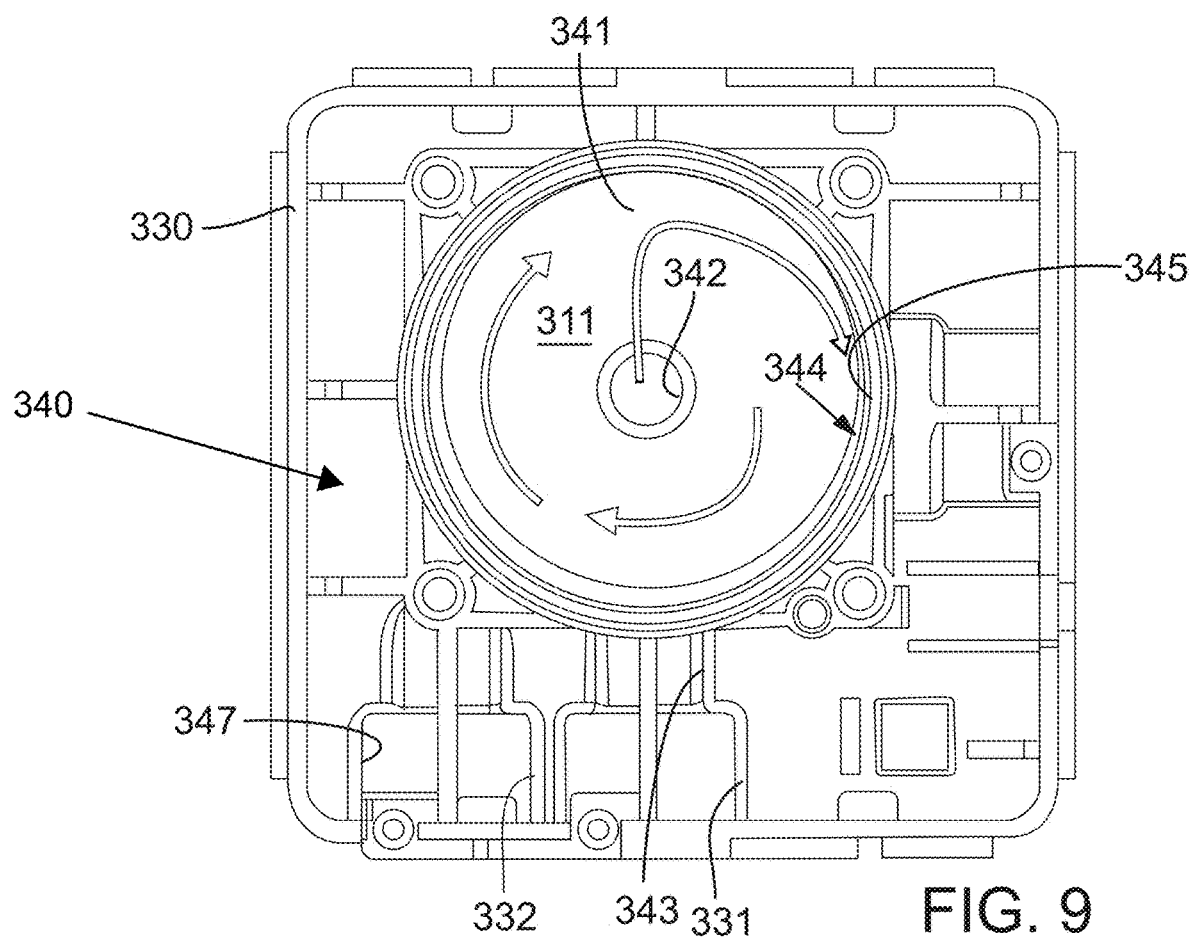
FIG. 9 illustrates a partial cross-sectional view from above the integrated housing shown in FIGS. 7 and 8.

FIGS. 8 and 9 show that the perimeter wall can define a recessed inlet port 331. The first side 340 of the housing 330 defines a substantially cylindrically-shaped recess forming the pump volute 311, and a floor of the recessed volute 311 is defined by a substantially circular lower wall 341. An aperture 342 in the lower wall forms an inlet to the pump volute 311 from the inlet port, with an inlet passage 343 extending between the inlet port 331 and the inlet 342 to the pump volute 311, fluidicly coupling the pump volute and the inlet port to each other.

The opposite (e.g., a second) side 333 of the housing 330 defines a second recessed region 350 defining the inlet (e.g., first) plenum 335 and the inlet manifold region 336. An opening 344 extends through a common wall 345 separating the inlet plenum 335 from the pump volute 311 (not shown in FIG. 10), fluidicly coupling the pump volute and the first plenum with each other. In some embodiments, the opening 344 extends generally tangentially of the cylindrically-shaped pump volute 311.

A charge port 349 can extend through the perimeter wall 348 and into the inlet plenum 335, allowing an assembled system to be charged with a working fluid after assembly is complete. After charging, a plug (not shown) can be inserted into the charge port 349 to seal it.

Figure 10:
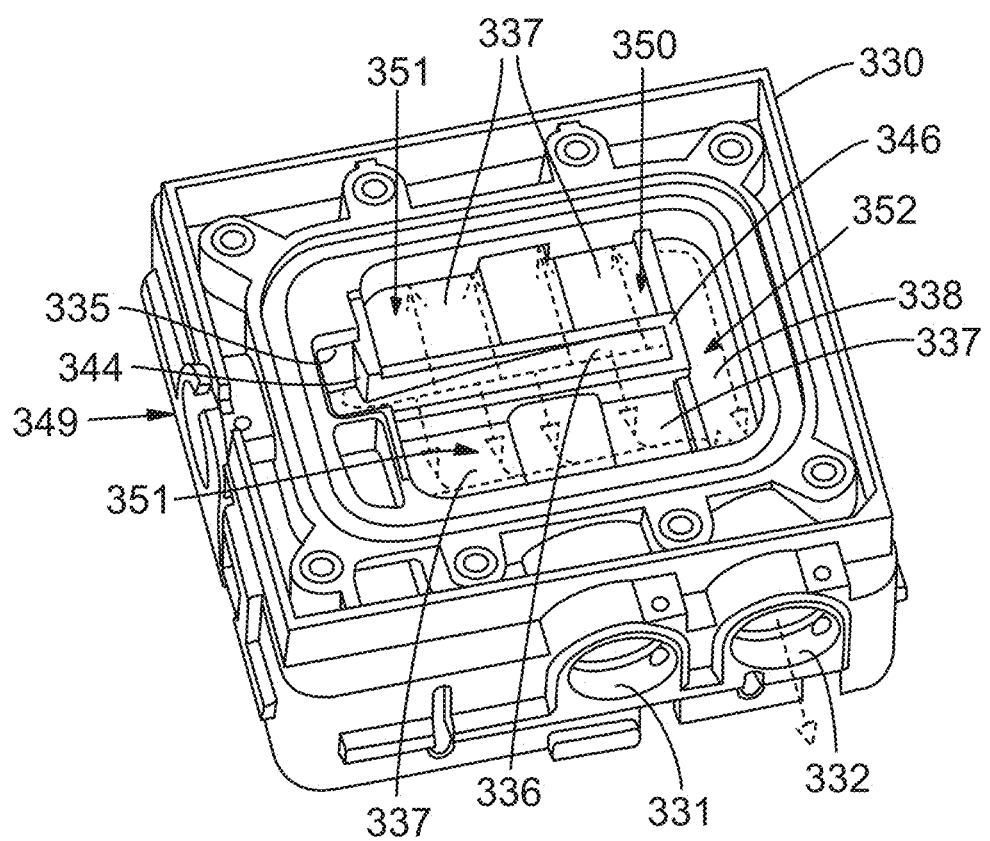
FIG. 10 illustrates an isometric view from below of the integrated housing shown in FIGS. 7, 8 and 9 with a flow path of a fluid shown as a dashed line.
Figure 11:
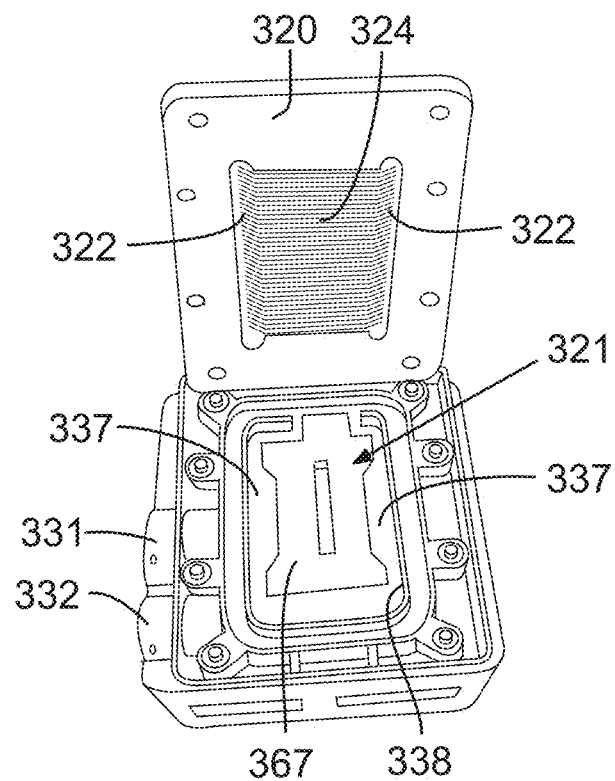
FIG. 11 illustrates an exploded view of a subassembly comprising the heat sink, the integrated housing and the manifold insert shown in FIG. 7.
Figure 12:
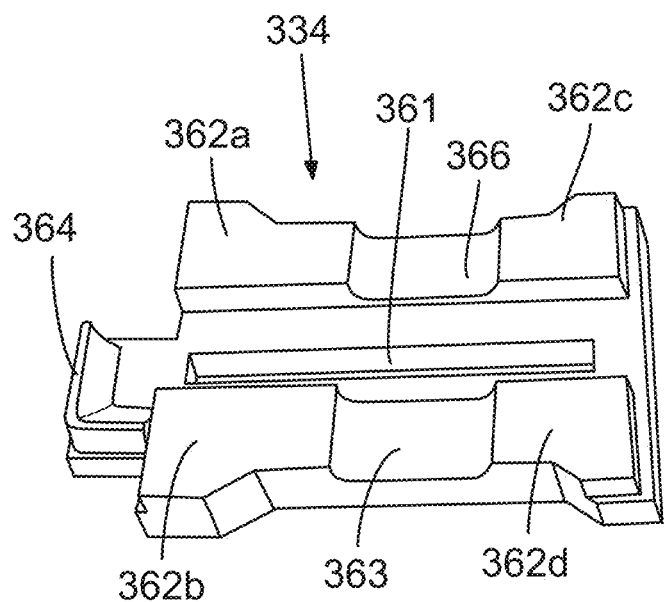
FIG. 12 illustrates an isometric view from above the insert shown in FIGS. 7 and 11.

As shown in FIG. 10, a depth of the inlet manifold 336 can taper from a relatively deeper region adjacent the inlet plenum 335 to a relatively shallower region spaced from the inlet plenum. As shown in FIG. 11 and described more fully below, a manifold insert 334 can be positioned adjacent, e.g., "overlie", as shown in FIG. 7, the sloped recess of the manifold region 336, at least partially forming an inlet manifold to the heat sink 320 and having a tapering cross-sectional area along a flow direction. The tapered manifold can distribute a substantially even mass-flow rate of working fluid among a plurality of channels in the heat sink 320.

The second side 333 of the housing 330 can define a third recessed region 351 (FIG. 10) defining respective portions of an exhaust manifold 337 (FIG. 11). As described more fully below, the third recessed region 351 can overlie a portion of the heat exchanger 320 and thereby receive a discharged working fluid from the microchannels.

A fourth recessed region 352 (FIG. 10) can define, at least in part, an outlet plenum 338. The third recess 351 and the fourth recess 352 can be fluidicly coupled to each other and separated by a wall 346 from the second recessed region 350. An opening 347 (FIG. 9) can extend between the outlet plenum 338 and the outlet port 332.

A manifold housing, or integrated housing, as described above can have a unitary construction formed using, for example, an injection molding technique, a machining technique, or other suitable process now known or hereafter developed. Also, any suitable material can be used in the construction of the housing, provided that the material is compatible with other components of the subassembly 300 and the working fluid. For example, common materials from which an injection-molded housing can be formed include polyphenylene sulfide (commonly referred to as "PPS"), polytetrafluoroethylene (commonly referred to as "PTFE" or the trade name TEFLON by the DuPont Company), and acrylonitrile butadiene styrene (commonly referred to as "ABS").

Although the housing described above has a unitary construction, other embodiments of the housing 330 can comprise an assembly of subcomponents. Nonetheless, a unitary construction typically has fewer separable couplings from which a working fluid can leak.

Manifold Insert

As noted above and shown in FIGS. 7 and 11, an insert 334 can be positioned between the heat exchanger 320 and the housing 330. Additionally, the insert 334 can have a contour generally corresponding to the configuration of one or more of the recessed regions 350, 351, 352 in the second side 333 of the housing 330. When the insert 334 is mated with the housing 330, the recessed regions 350, 351 and 352, in combination with the contoured insert 334, can define several conduits, or fluid couplers, suitable for conveying a working fluid so as to fluidicly couple the heat exchanger 320 with the pump volute 311 and the outlet port 332.

For example, the insert 334 can define an opening extending through the body 360 and generally overlying the tapered manifold portion 336 defined by the housing 330.

The opening can include a recessed region 365 and an aperture 361. The recessed region 365 and the tapered recess 336 in the housing together define a chamber of the inlet manifold. As described below, the manifold can distribute working fluid among the several microchannels within the heat sink.

The body 360 of the insert 334 can matingly engage with one or more features of the housing 330. For example, the body 360 can define a plurality of spaced apart members 362a, b, c, d and a trough-shaped recess 363 extending transversely relative to the aperture 361. The trough-shaped recess 363 can extend between the members 362a, c and between the members 362b, d. When the insert 334 is assembled with the housing 330, the members 362a, b, c, d are positioned in corresponding portions of the second recessed region 351, and a corresponding ridge 339 (FIG. 10) is positioned within the trough-shaped recess 363. By straddling features defined by the housing, the insert is configured to align the aperture 361 with the tapered manifold region 336 in a generally repeatable fashion.

The insert body 360 also defines a contoured tab 364 configured to overly the recessed inlet plenum 335. In addition, a shoulder 366 within the second recessed region 365 of the insert urges against the wall 346 (FIG. 10), providing a seal separating the inlet manifold from the exhaust manifold and outlet plenum.

In a working embodiment, the recessed region 365 (FIG. 19) is tapered, having at least one cross-sectional dimension that diminishes with increasing depth of the recess. As explained more fully below, the recess 365 and the aperture 361 in the insert can generally overlie a groove 325 (FIG. 19) in the heat sink fins. In some instances, a slope of a wall defining the tapered recess 365 adjacent the aperture 361 can be matched to (e.g., can correspond to, or, alternatively, be the same as) a slope of the recessed groove 325 adjacent a distal end of the heat sink fins, providing a relatively smooth and continuous flow transition.

The insert can have one or more (e.g., a pair) of generally conformable, flat surfaces 367 laterally flanking the aperture 361 (FIG. 11). As shown in FIG. 19, the surfaces 367 can generally overlie respective portions of the heat exchanger 320 (e.g., the distal ends 401 of heat sink fins 400 (FIGS. 16 and 17)), defining an upper flow boundary of the microchannels extending between adjacent fins, similar to the plate 240 shown in FIGS. 5 and 6. The conformable surfaces 367 can urge against the respective distal ends, and conform to variations in height among the plurality of fins, and within a given fin (e.g., a fin having a non-linear longitudinal contour resulting from variations in fin height $h_2$ (FIGS. 18A and 18B)). The conformable surfaces 367 can reduce or eliminate the need for secondary machining operations used to make the respective distal ends of the fins generally coplanar and compatible with, for example, a rigid plate. As well, conformable surfaces 367 urging against the distal ends 401 of the fins 400 (400') can form a seal with the fins and prevent a working fluid from bypassing the channels defined between adjacent fins.

The insert body 360 can be formed using, for example, an injection molding technique, a machining technique, or other suitable process now known or hereafter developed. In a working embodiment, the body 360 is formed of a compliant polymeric material that generally conforms to and seals against adjacent surfaces. Any suitable material can be used to form the insert body 360, provided that the selected material is compatible with other components of the subassembly 300 and the selected working fluid. For example, common materials from which the insert body can be formed include silicone or any other suitably compliant material.

Flow Distribution

Flow of a working fluid through the integrated assembly 300 is now described. From a remotely positioned heat exchanger (not shown), a working fluid passes into the inlet port 331 and into the channel 343 extending between the inlet port and the inlet 342 to the pump volute 311. A floor 341 of the pump volute defines a wall separating the channel 343 from the pump volute. From the channel 343, the working fluid passes through the aperture 342 and into the volute 311. An impeller 312 positioned in the pump volute 311 rotates and increases a pressure head in the working fluid before the fluid passes from the pump volute through the opening 344 and into the inlet plenum 335.

As indicated by the arrows in FIG. 10, the working fluid can pass from the inlet plenum 335 and into a chamber formed between the second recessed region 365 in the insert 334 and the inlet manifold portion 336 of the housing. From the chamber, the working fluid passes through the aperture 361.

As described above in connection with FIGS. 2, 3 and 4, the heat exchanger shown in FIGS. 7, 11, 13 and 14 can comprise a heat transfer region 324 defining a plurality of microchannel passages. The aperture 361 can overlie the heat transfer region 324, and the flow of working fluid can be distributed among the plurality of microchannel passages in the heat sink. As with the assembly shown in FIGS. 5 and 6, a flow of working fluid within the microchannel can generally be an impinging flow divided into a first portion and a second portion flowing outwardly from the impingement region in generally opposite directions.

In the illustrated assembly 300 (FIG. 7), the insert 334 (e.g., the members 362 a,b,c,d) partially occupies the third recessed region 351, leaving a pair of opposed portions of the region unfilled and defining opposed exhaust manifold portions 337 overlying end regions of the microchannels and flanking the central region adjacent the aperture 361 (FIG. 11). The outwardly directed flow of coolant can exhaust from the microchannel passages into a respective one of the exhaust manifold portions 337. From the manifold portions 337, the working fluid passes into the outlet plenum 338 (FIG. 11), and through the conduit 347 to the outlet port 332.

Additional Heat Exchanger Configurations

Additional heat sink embodiments are described with reference to FIGS. 13, 13A, 14, 14A, 15, 16, 17, 18A and 18B and 19. As with the heat sink illustrated in FIG. 2 through FIG. 6, the heat sinks 320, 320' shown in FIGS. 13 and 14 define respective heat transfer regions 324, 324' having a plurality of juxtaposed fins (e.g., fins 400) defining a corresponding plurality of microchannels (e.g., microchannels 404, 404') between adjacent fins.

Each of the fins 400, 400' extend from a heat spreader, or base, 326, to a respective distal end 401, 401'. Flanking grooves 322, 322' (FIGS. 13 and 14) can extend orthogonally relative to opposed outer ends of the microchannels 404, 404', forming a portion of an exhaust manifold. When incorporated in the assembly 300, the grooves 322, 322' are generally positioned adjacent opposed exhaust manifold portions 337.

Figure 14:
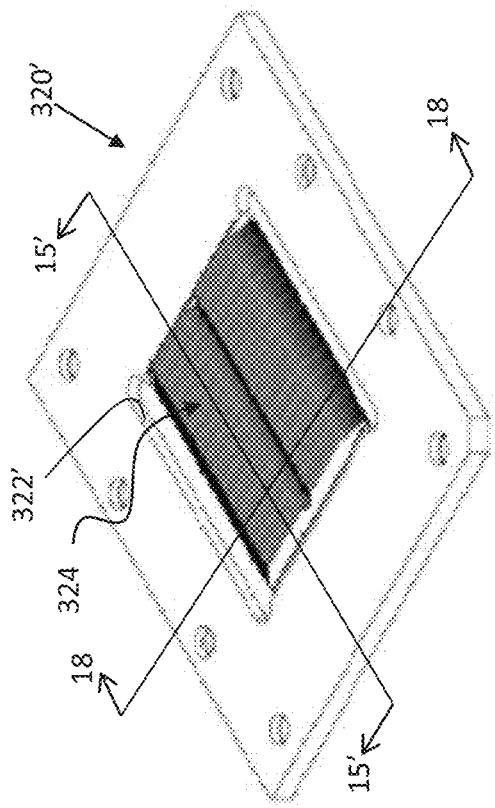
FIG. 14 illustrates an isometric view of another embodiment of a heat sink shown in FIG. 7.
Figure 15:
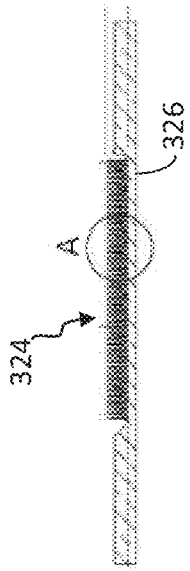
FIG. 15 illustrates a typical cross-sectional view of a heat sink as shown in FIG. 7, e.g., as taken along Section 15-15 in FIG. 13 or in FIG. 14.
Figure 13:
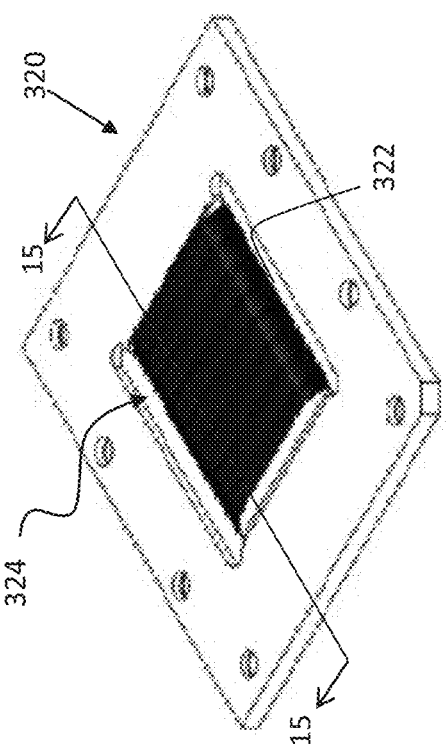
FIG. 13 illustrates an isometric view of a heat sink as shown in FIG. 7.
Figure 13A:
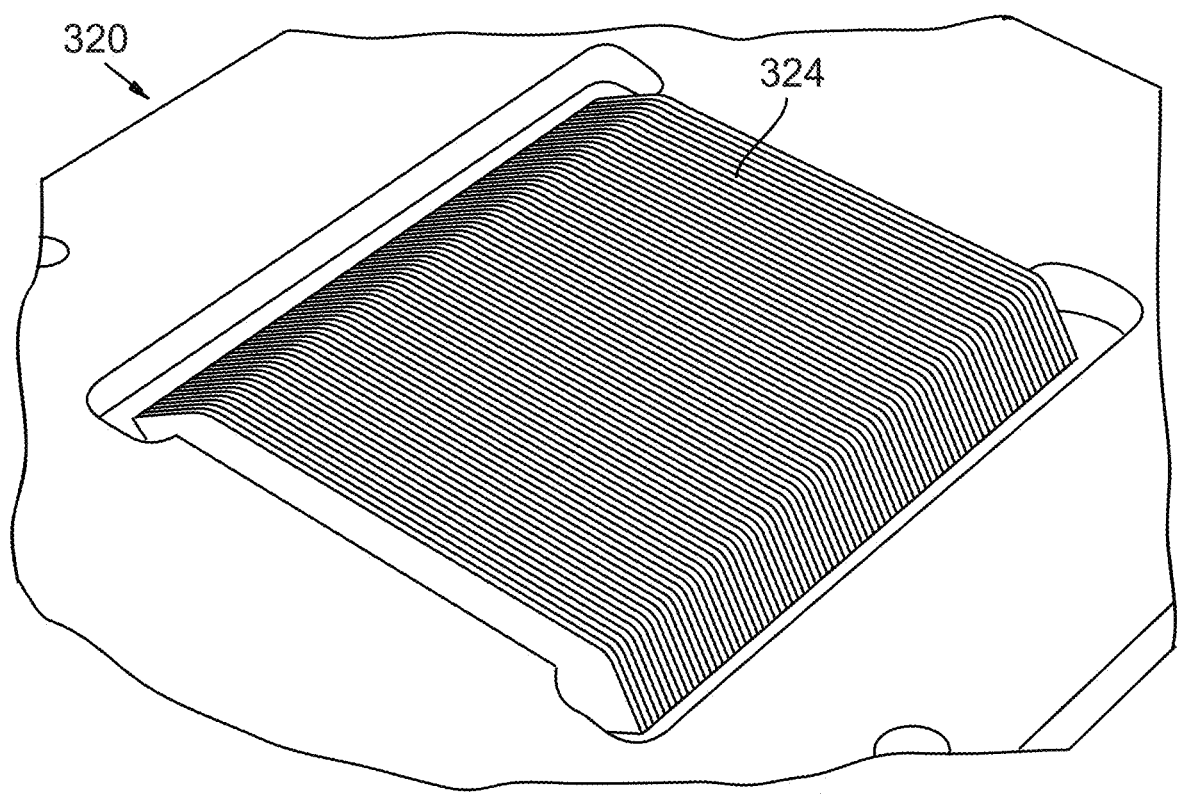
FIG. 13A shows a magnified view of a portion of the heat sink shown in FIG. 13.
Figure 14A:
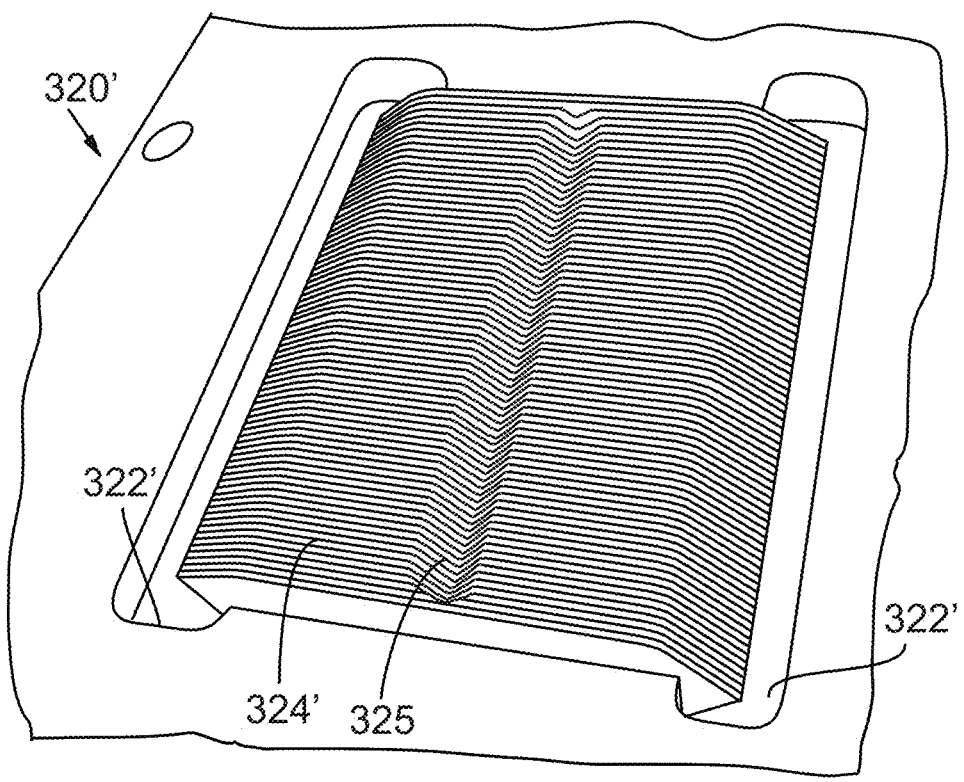
FIG. 14A shows a magnified view of a portion of the heat sink shown in FIG. 14.
Figure 17:
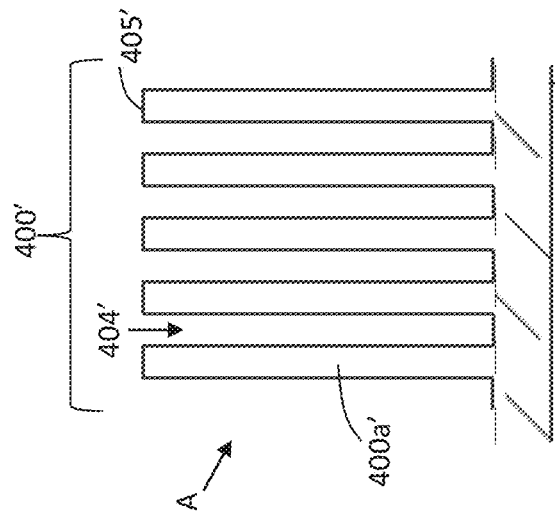
FIG. 17 illustrates an example of blunt fins.
Figure 16:
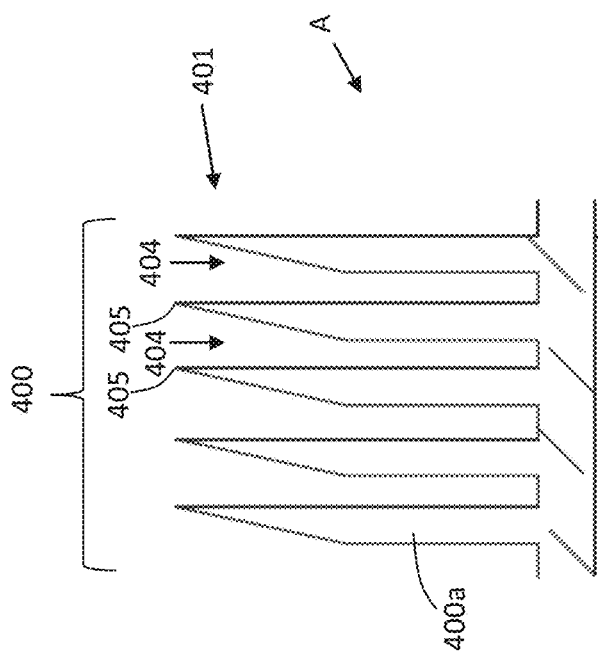
FIG. 16 illustrates an example of beveled fins.

FIG. 15 shows a typical cross-sectional view of the heat sinks 320, 320' along section line 15-15 (FIG. 13) or 15'-15' (FIG. 14), respectively. FIGS. 16 and 17 show alternative fin configurations from the circled portion "A" of a typical heat transfer region shown in cross-section in FIG. 15.

The distal ends of the fins can have a variety of configurations, as indicated in FIGS. 16 and 17. For example, the blunt distal ends 405' are shown as being relatively flat and generally coplanar. Alternatively, the distal ends 401 are shown as being beveled, giving each fin 400a a comparatively shorter face and a comparatively taller face, with a relatively sharp apex 405 positioned therebetween.

It is believed that the relatively sharp apex 405 formed by the beveled distal ends 401 can improve transition of a flow direction (e.g., a 90-degree bend) from being generally parallel to the base 326 and orthogonal to the fins 400 to a direction being generally orthogonal to the base 326 and generally parallel to the fins. Accordingly, it is surmised that fins 400 having sharp apices 405 formed by beveled distal ends can reduce head losses in the working fluid as it passes from the insert manifold 365 to the microchannels 404 as compared to, for example, fins 400' having generally blunt distal ends 405'. It is believed that positioning the relatively taller face of a given fin upstream of the relatively shorter face of the same fin (e.g., placing the sharp apex in an upstream position relative to the respective fin), provides a relatively larger reduction in head loss than if the flow approaches the beveled fin from an opposite direction.

The beveled distal ends 401 can be formed using any suitable technique for beveling thin walls. For example, such bevels can be produced when forming the fins 400 using a skiving technique. Other, e.g., proprietary, techniques can be used to form the bevels. For example, it is believed that the fin-forming technique employed by Wolverine Tube, Inc. can be used to produce microchannel heat sinks having beveled fins. However, it is also believed that the respective distal ends of such "raw" fins may not be coplanar (apart from a recessed region forming a portion of a transverse groove). By incorporating the compliant insert 334, which can urge against and form a seal with uneven fins, secondary machining operations that would tend to dull the sharp apices 405 can be eliminated, saving costs and improving performance. Maintaining sharp apices 405 and forming a seal with the manifold insert can reduce head losses in the coolant, while still reducing or eliminating leakage between adjacent microchannels 404 that might otherwise occur through gaps that would otherwise be formed between the "raw" fins and, e.g., a generally planar, rigid plate.

As shown in FIG. 14, a transverse groove 325 can extend transversely relative to the fins 400. As noted above, the aperture 361 in the manifold insert 334 can generally overlie the groove 325, defining a flow transition that hydraulically couples in parallel each of the microchannels 404 to at least one other of the microchannels.

FIG. 19 shows a cross-sectional view of one example of such a flow transition. The recessed region 365 defined by the insert body 360 and the recessed groove 325 together define a substantially larger characteristic length, e.g., hydraulic diameter, than the aperture 361 does alone. For example, the recessed region 365, the aperture 361 and the groove 325 can together define a flow transition having a hydraulic diameter between about 150% and about 200% larger than the corresponding hydraulic diameter of the aperture 361 alone, which can provide a substantially lower head-loss coefficient for the assembled flow transition.

Figure 19:
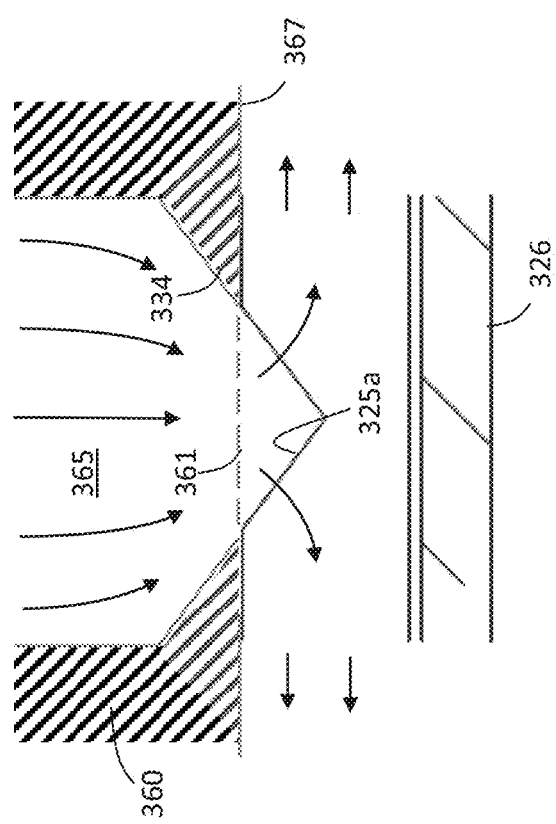
FIG. 19 illustrates a cross-sectional view of a heat sink as shown in FIG. 18A with the manifold insert shown in FIG. 12 overlying the fins of the heat sink.
Figure 19A:
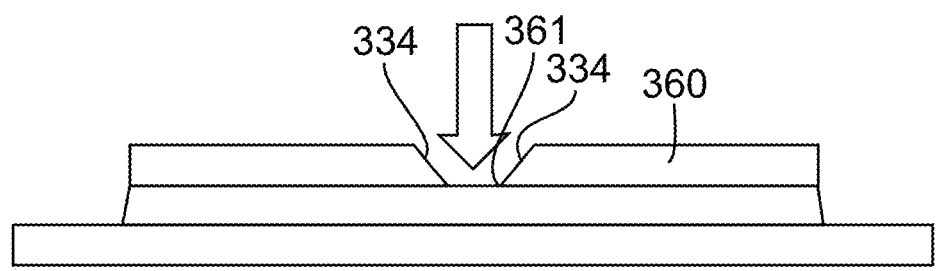
FIG. 19A illustrates a cross-sectional view of a heat sink as shown in FIG. 18A having the manifold insert shown in FIG. 12 overlying the fins of the heat sink.

Increasing the characteristic length scale of the transition from the inlet manifold to the microchannels of the heat sink 320 can reduce pressure losses in a fluid passing through the transition and increase the flow rate of the fluid in correspondence with the pump's performance. The increase in fluid flow rate resulting from a lower head-loss coefficient can improve local heat transfer rates from the fins compared to a configuration in which the aperture 361 overlies an array of uniform height fins. The combination of the tapered recess 365 and the heat sink groove 325 (e.g., in FIG. 19A) allows the working fluid to penetrate relatively deeper in the microchannels in a region adjacent the aperture 361 than the fluid otherwise would in the absence of the groove (e.g., in the case of an array of uniform height fins shown in FIG. 19A).

The groove 325 can be formed by defining a respective recess in each of the plurality of fins 400. The plurality of recessed regions can be so juxtaposed as to define the groove 325.

Figure 18B:
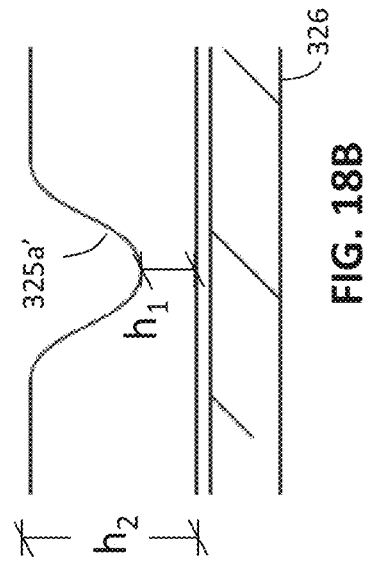
FIG. 18B illustrates a cross-sectional view of a heat sink having a generally parabolic, transverse groove in its fins as taken along section line 18-18 in FIG. 14.
Figure 18A:
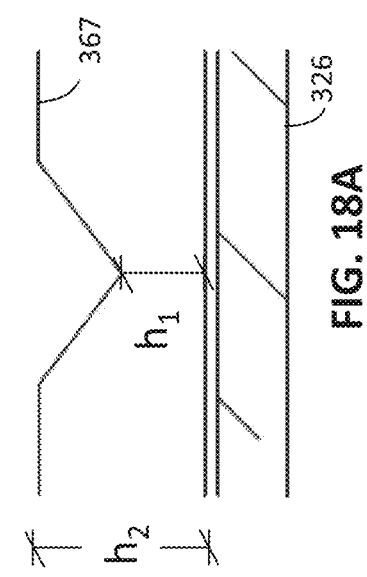
FIG. 18A illustrates a cross-sectional view of a heat sink having a v-shaped, transverse groove in its fins as taken along section line 18-18 in FIG. 14.

In FIGS. 18A and 18B, the lowermost extent of each recessed groove 325a, 325b is spaced a distance $h_1$ from the heat spreader 326. In other embodiments, the lowermost extent of the recessed groove 325 is substantially coextensive with the heat spreader 326 (i.e., $h_1 \leq 0$). In some embodiments, a ratio of a representative height $h_2$ of the fins to the distance $h_1$ can be between about 10:1 and about 10:7, such as, for example, between about 3:1 and about 2:1.

Figure 19B:
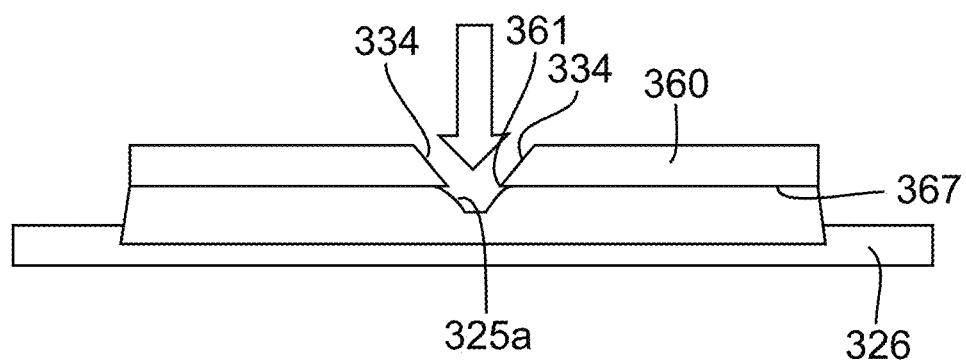
FIG. 19B illustrates another cross-sectional view of a heat sink defining a transverse groove and having the manifold insert shown in FIG. 12 overlying the fins.

Although a v-shaped notch is shown in FIG. 18A, and a generally parabolic recess is shown in FIG. 18B, other recessed groove configurations are possible. For example, the groove can have a generally hyperbolic cross-sectional shape, or a cross-section with at least one substantially straight edge (e.g., an L-shaped recess, a flattened "V"-shaped grove as shown in FIG. 19B). As noted above, a slope of the groove 325 adjacent the manifold body can be substantially continuous with a slope of a wall defining the recessed region 365 in the manifold body 360 adjacent the groove, when the integrated assembly 300 is assembled. Such a continuous slope can provide generally lower head losses through the transition than in transitions having a discontinuity in wall slope (e.g., between the recess in the insert and the groove).

Other Exemplary Embodiments

The examples described above generally concern fluidic heat transfer systems configured to cool one or more electronic components, such as integrated circuits. Nonetheless, other applications for disclosed heat transfer systems are contemplated, together with any attendant changes in configuration of the disclosed apparatus. Incorporating the principles disclosed herein, it is possible to provide a wide variety of systems configured to transfer heat using a fluid circuit. For example, disclosed systems can be used to transfer heat to or from components in a data center, laser components, light-emitting diodes, chemical reactions, photovoltaic cells, solar collectors, and a variety of other industrial, military and consumer devices now known and hereafter developed.

Directions and references (e.g., up, down, top, bottom, left, right, rearward, forward, etc.) may be used to facilitate discussion of the drawings but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or."

Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of fluid heat exchange systems that can be devised using the various concepts described herein. Moreover, those of ordinary skill in the art will appreciate that the exemplary embodiments disclosed herein can be adapted to various configurations without departing from the disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are know or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

Thus, in view of the many possible embodiments to which the disclosed principles can be applied, it should be recognized that the above-described embodiments are only examples and should not be taken as limiting in scope. I therefore reserve all rights to the subject matter disclosed herein, including the right to claim all that comes within the scope and spirit of the following claims, as well as all aspects of any innovation shown or described herein.

The invention claimed is:

1. A heat-exchange device for cooling an electronic component, the heat-exchange device comprising:
a housing having an inlet port and an outlet port, the housing defining an interior region having a pump volute;
a heat-spreader plate having a plurality of fins defining a corresponding plurality of microchannels;
an insert defining a pair of flat surfaces laterally spaced apart from each other, providing an elongate flow passage between the flat surfaces, wherein the flat surfaces overlie the fins and define a flow boundary of the microchannels opposite the heat-spreader plate, the elongate flow passage being oriented transversely across and open to the plurality of microchannels;
an impeller positioned within the pump volute and configured to rotate therein to urge a coolant to flow through the heat-exchange device,
wherein the insert occupies a portion of the interior region of the housing and leaves opposed portions of the interior region outward of the flat surfaces unoccupied, defining a pair of opposed exhaust manifolds opening from the plurality of microchannels,
wherein the housing is spaced from the pair of flat surfaces and wherein a portion of the insert defines a raised seal member extending to the housing from each of the flat surfaces, the raised seal member being configured to prevent a liquid from bypassing the microchannels as the liquid flows between the inlet port and the outlet port, the insert being a continuous, monolithic member defining the pair of flat surfaces and the seal member,
wherein the raised seal member comprises a plurality of spaced apart members and the insert further defines a recess between the members, wherein the housing defines a ridge corresponding to the recess between the members of the insert and a recess corresponding to each of the members of the insert, wherein the insert matingly engages with the housing so the spaced apart members of the insert are positioned in the corresponding recesses of the housing and the ridge of the housing is positioned in the recess between the members of the insert; and
an outlet passage fluidly coupling the pair of opposed exhaust manifolds with each other upstream of the outlet port.

2. The heat-exchange device according to claim 1, wherein the pair of exhaust manifolds flank the elongate passage laterally outward of the pair of flat surfaces.

3. The heat-exchange device according to claim 1, wherein each microchannel extends from a first end positioned adjacent one of the exhaust manifolds to a second end positioned adjacent the other of the exhaust manifolds.

4. The heat-exchange device according to claim 1, wherein the plurality of microchannels comprises a pair of opposed outer microchannels and an inner microchannel positioned between the outer microchannels, wherein one or both of the exhaust manifolds is relatively larger adjacent the central microchannel than adjacent the outer microchannels.

5. The heat-exchange device according to claim 1, wherein the interior region of the housing further defines an inlet passage coupling the inlet port with the pump volute, and an outlet from the pump volute, wherein the elongate flow passage and the outlet from the pump volute are fluidly coupled with each other.

6. The heat-exchange device according to claim 1, wherein the continuous, monolithic member is compliant.

7. The heat-exchange device according to claim 6, wherein the housing defines a major surface opposite the pump volute, wherein the insert defines a first major surface and an opposed second major surface, the first major surface of the insert comprising the pair of flat surfaces and the second major surface of the insert defining the raised seal member, the spaced apart members, or a combination thereof.

8. The heat-exchange device according to claim 1, further comprising:
a fluid inlet passage fluidly coupling the inlet port with each microchannel, through the elongate flow passage between the flat surfaces of the insert, wherein each microchannel has a first end and a second end and the plurality of microchannels defines a pair of opposed outer microchannels and a centrally located microchannel positioned between the opposed outer microchannels, the outlet passage being enlarged adjacent the first end and the second end of the centrally located microchannel compared to adjacent one or both of the opposed outer microchannels.

9. The heat-exchange device according to claim 8, wherein the pair of exhaust manifolds flank the elongate passage laterally outward of the pair of flat surfaces.

10. The heat-exchange device according to claim 8, wherein the housing defines a pump volute, an inlet passage coupling the inlet port with the pump volute, and an outlet from the pump volute, the heat-exchange device further comprising an impeller positioned in the pump volute, wherein the elongate flow passage and the outlet from the pump volute are fluidly coupled with each other.

11. The heat-exchange device according to claim 8, wherein the continuous, monolithic member is compliant.

12. The heat-exchange device according to claim 11, wherein the housing defines a major surface opposite the pump volute, wherein the insert defines a first major surface and an opposed second major surface, the first major surface of the insert comprising the pair of flat surfaces and the second major surface of the insert defining the raised seal member, the spaced apart members, or a combination thereof.

13. A heat-exchange device for cooling an electronic component, the heat-exchange device comprising:
- a housing having an inlet port and an outlet port, the housing defining a pump volute;
- an impeller positioned within the pump volute and configured to rotate therein to urge a coolant to flow through the heat-exchange device;
- a heat-spreader plate having a plurality of fins defining a corresponding plurality of microchannels, wherein the heat-spreader plate is mechanically coupled with the housing, the housing and the heat-spreader plate together defining an interior region of the heat-exchange device;
- an insert that defines a pair of opposed flat surfaces overtop the fins to define a flow boundary of the microchannels opposite the heat-spreader plate, wherein the insert defines an elongate slot oriented transversely overtop the plurality of microchannels at a position between the opposed flat surfaces;
- wherein the insert occupies a portion of the interior region of the heat-exchange device and leaves a pair of opposed portions of the interior region overtop the fins unoccupied;
- wherein a seal member extends to the housing at a position between the elongate slot and the unoccupied opposed portions of the interior region to prevent a liquid from bypassing the microchannels as the liquid flows between the inlet port and the outlet port;
- wherein the seal member further defines a plurality of raised, spaced-apart members and a recess between the members, wherein the housing defines a recess corresponding to each of the raised, spaced-apart members of the insert, wherein the seal member matingly engages with the housing so the raised, spaced-apart members of the seal member are positioned in the corresponding recesses of the housing and a portion of the housing is positioned in the recess between the raised, spaced-apart members of the seal member.

14. The heat-exchange device according to claim 13, wherein the unoccupied, opposed portions of the interior region flank the elongate slot laterally outward of the opposed flat surfaces.

15. The heat-exchange device according to claim 13, wherein each microchannel extends from a first end positioned adjacent one of the unoccupied, opposed portions of the interior region to a second end positioned adjacent the other of the unoccupied, opposed portions of the interior region.

16. The heat-exchange device according to claim 13, wherein the interior region of the housing further defines an inlet passage coupling the inlet port with the elongate slot.

17. The heat-exchange device according to claim 13, wherein the seal is a portion of the insert, defining an insert-and-seal member.

18. The heat-exchange device according to claim 17, wherein the housing defines a major surface opposite the pump volute, wherein the major surface defined by the housing defines the recess corresponding to each of the raised, spaced-apart members, wherein the insert defines a first major surface and an opposed second major surface, the first major surface of the insert comprising the pair of flat surfaces and the second major surface of the insert defining each of the raised, spaced-apart members.

19. The heat-exchange device according to claim 13, wherein the insert also leaves a portion of the interior region unoccupied to define a segment of a fluid inlet passage.

20. The heat-exchange device according to claim 19, wherein the fluid inlet passage fluidically couples the inlet port with each microchannel through the elongate slot defined by the insert.

21. The heat-exchange device according to claim 19, wherein the pair of opposed portions of the interior region left unoccupied by the insert define a pair of opposed exhaust manifolds.

22. The heat-exchange device according to claim 17, wherein the insert-and-seal member is compliant.

23. The heat-exchange device according to claim 22, wherein the housing defines a major surface opposite the pump volute, wherein the insert-and-seal member defines a first major surface and an opposed second major surface, the first major surface of the insert-and-seal member comprising the pair of flat surfaces and the second major surface of the insert-and-seal member defining the spaced apart members.

24. A heat-exchange device for cooling an electronic component, the heat-exchange device comprising:
- a housing having an inlet port and an outlet port, the housing defining a pump volute;
- an impeller positioned within the pump volute and configured to rotate therein to urge a coolant to flow through the heat-exchange device;
- a heat-spreader plate having a plurality of fins defining a corresponding plurality of microchannels, wherein the heat-spreader plate is mechanically coupled with the housing opposite the pump volute, the housing and the heat-spreader plate together defining an interior region of the heat-exchange device;
- an insert body positioned between the heat-spreader plate and the housing, wherein the insert body leaves a central coolant passageway and opposed coolant passageways flanking the central coolant passageway unoccupied, wherein the housing defines a recess opposite the pump volute and the insert body defines a raised region corresponding to the recess defined by the housing, wherein the insert body further defines a recess and so matingly engages with the housing that the recess opposite the pump volute receives the raised region of the insert body and the recess defined by the insert body receives a portion of the housing, wherein the insert body so occupies a portion of the interior region of the heat exchanger as to separate the central coolant passageway from the opposed, flanking coolant passageways so that coolant must pass through the microchannels as the coolant flows through the heat-exchange device.

25. A heat-exchange device according to claim 24, wherein the insert body comprises a seal, wherein the heat-exchange device further comprises a plate positioned overtop the plurality of fins.

26. A heat-exchange device according to claim 25, wherein the seal is a portion of the plate, and together the seal and the plate define a manifold insert.

27. A heat-exchange device according to claim 25, wherein the manifold insert is made of a compliant material.

28. A heat-exchange device according to claim 25, wherein the seal extends from the plate to the housing.

29. A heat-exchange device according to claim 25, wherein the seal and the plate are separate components.

30. The heat-exchange device according to claim 24, wherein the unoccupied, opposed coolant passageways flank the central coolant passageway laterally outward of the insert body.

31. The heat-exchange device according to claim 24, wherein each microchannel extends from a first end positioned adjacent one of the unoccupied, opposed coolant passageways to a second end positioned adjacent the other of the unoccupied, opposed coolant passageways.

* * * * *